(12) United States Patent
Iwamoto et al.

(10) Patent No.: US 7,548,135 B2
(45) Date of Patent: Jun. 16, 2009

(54) FILTER AND DUPLEXER

(75) Inventors: Yasuhide Iwamoto, Kawasaki (JP); Shogo Inoue, Kawasaki (JP); Masanori Ueda, Yokohama (JP)

(73) Assignees: Fujitsu Media Devices, Yokohama (JP); Fujitsu Limited, Kawasaki (JP)

( * ) Notice: Subject to any disclaimer, the term of this patent is extended or adjusted under 35 U.S.C. 154(b) by 330 days.

(21) Appl. No.: 11/407,284

(22) Filed: Apr. 20, 2006

(65) Prior Publication Data

US 2006/0238272 A1 Oct. 26, 2006

(30) Foreign Application Priority Data

Apr. 21, 2005 (JP) ............... 2005-123189

(51) Int. Cl.
H03H 9/72 (2006.01)
H03H 9/64 (2006.01)
H03H 9/54 (2006.01)
(52) U.S. Cl. .................. 333/133; 333/193; 333/189
(58) Field of Classification Search ............ 333/133, 333/193, 187, 189
See application file for complete search history.

(56) References Cited

U.S. PATENT DOCUMENTS

| 6,756,864 B2* | 6/2004 | Muramatsu ............... 333/133 |
| 6,927,649 B2* | 8/2005 | Metzger et al. ............ 333/133 |
| 7,023,296 B2* | 4/2006 | Uriu et al. ................. 333/132 |
| 7,034,635 B2* | 4/2006 | Nakamura et al. ......... 333/133 |
| 7,138,888 B2* | 11/2006 | Yamakawa et al. ......... 333/133 |
| 7,190,970 B2* | 3/2007 | Ochii et al. ............... 455/553.1 |
| 7,242,268 B2* | 7/2007 | Hagiwara et al. .......... 333/133 |
| 7,253,702 B2* | 8/2007 | Kemmochi et al. ......... 333/133 |
| 2003/0020562 A1 | 1/2003 | Ikada et al. |
| 2003/0025572 A1 | 2/2003 | Maekawa et al. |
| 2003/0090338 A1 | 5/2003 | Muramatsu |
| 2003/0214367 A1 | 11/2003 | Uriu et al. |
| 2004/0212451 A1* | 10/2004 | Iwamoto et al. ............ 333/133 |
| 2004/0219888 A1* | 11/2004 | Iwamoto et al. ............ 455/76 |

FOREIGN PATENT DOCUMENTS

| CN | 1437423 A | 8/2003 |
| DE | 102 34 737 A1 | 4/2003 |
| EP | 1 160 972 A2 | 12/2001 |
| JP | 8-018393 A | 1/1996 |
| JP | 10-075153 A | 3/1998 |
| JP | 2001-339273 A | 12/2001 |
| JP | 2004-336181 A | 11/2004 |
| KR | 10-2004-0093438 A | 11/2004 |

* cited by examiner

Primary Examiner—Barbara Summons
(74) Attorney, Agent, or Firm—Arent Fox LLP

(57) ABSTRACT

A filter includes a filter chip, a laminated portion on which the filter chip is mounted, an input/output terminal provided in the laminated portion, a first U-shaped line pattern provided on a first layer and coupled to the filter chip, the first layer being included in the laminated portion between the filter chip and the input/output terminal, and a second U-shaped line pattern provided on a second layer to substantially overlap the first U-shaped line pattern and coupled to the first U-shaped line pattern and the input/output terminal, the second layer being included in the laminated portion between the first layer and the input/output terminal.

14 Claims, 16 Drawing Sheets

← --- CURRENT DIRECTION

← --- CURRENT DIRECTION

FILTER AND DUPLEXER

BACKGROUND OF THE INVENTION

1. Field of the Invention

This invention generally relates to filters and duplexers, and more particularly, to filter and a duplexer mounted on a laminated package or a laminated substrate.

2. Description of the Related Art

In recent years, mobile terminal devices and personal digital assistances have been widely used with the developments in the mobile communication system. The mobile terminal devices utilize high frequency ranges of 800 MHz to 2.0 GHz. Accordingly, there have been proposed high-frequency filters provided to the devices for use in mobile communication and antenna duplexers having the high-frequency filters.

Elastic wave filters, for example, are used as the high-frequency filters. The elastic wave filters include surface acoustic wave (SAW) filters that are small-sized, lightweight, and excellent in shape factor and film bulk acoustic Resonator (FBAR) filters that are excellent in high-frequency characteristics and can be downsized. There are demands for higher performance, downsizing, and cost reduction of the high-frequency filters and duplexers. Accordingly, there have been proposed filters in which a filter chip is mounted on the laminated package having a laminated portion or the laminated substrate and duplexers in which the filter is included.

Japanese Patent Application Publication No. 2004-336181 (hereinafter, referred to as Document 4) discloses the filter and the duplexer having a filter chip mounted on a laminated package or laminated substrate having a laminated portion in which a ceramic substrate and the like are laminated. There are other conventional techniques that downsize the filter and duplexer. A line pattern for phase matching is provided in two layers, as disclosed in Japanese Patent Application Publication No. 8-18393 (hereinafter, referred to as Document 1). Multiple line patterns for phase matching are provided, as disclosed in Japanese Patent Application Publication No. 10-75153 (hereinafter, referred to as Document 2). Multiple line patterns for phase matching are also provided in the circumference of the chip, as disclosed in Japanese Patent Application Publication No. 2001-339273 (hereinafter, referred to as Document 3). The line pattern for phase matching is provided in multiple layers, as disclosed in Document 4.

Document 1 describes that the line pattern for phase matching is provided in two layers. However, the line pattern for phase matching is provided only on the side of an antenna terminal, and there is no description on the line for phase matching provided on a transmitting terminal or receiving terminal. This is because the technique disclosed in Document 1 is applied to the duplexer for 800 MHz band, which has less influence of parasite impedance of the package than that of the duplexer for 2 GHz band. For this reason, there exists a problem that cannot be solved, if the filter matching is not successful in the high-frequency duplexer of 2 GHz band.

Document 2 describes that the multiple line patterns for phase matching are provided. However, the line for phase matching provided on the side of the transmitting terminal or on the side of the receiving terminal is not provided in two layers. This also causes a problem that cannot be solved, if the filter is not matched in the high-frequency duplexer of 2 GHz band especially.

Document 3 describes that the multiple line patterns for phase matching are provided in the circumference of the chip. Accordingly, the package size becomes larger and cannot be reduced.

Document 4 describes that the line pattern for phase matching is provided in multiple layers. However, there is no description on the direction of current flowing through the line pattern for phase matching. Accordingly, there exist problems that a large self-inductance cannot be created in a small space and the impedance matching cannot be improved by the capacitance between the signal line and the ground.

SUMMARY OF THE INVENTION

The present invention has been made in view of the above circumstances and provides a filter and a duplexer, to which an inductor or a capacitor can be applied with ease and the size of which can be reduced.

According to one aspect of the present invention, preferably, there is provided a filter including: a filter chip; a laminated portion on which the filter chip is mounted; an input/output terminal provided in the laminated portion; a first U-shaped line pattern provided on a first layer and coupled to the filter chip, the first layer being included in the laminated portion between the filter chip and the input/output terminal; and a second U-shaped line pattern provided on a second layer to substantially overlap the first U-shaped line pattern and coupled to the first U-shaped line pattern and the input/output terminal, the second layer being included in the laminated portion between the first layer and the input/output terminal. In accordance with the present invention, two U-shaped line patterns are formed to substantially overlap each other. This increases the self-inductance of the line patterns. It is therefore possible to provide a filter to which the inductor can be applied and which can be downsized. It is also possible to provide a filter to which a capacitive component is hardly applied and which has a small insertion loss.

According to another aspect of the present invention, preferably, there is provided a filter including: a filter chip; a laminated portion on which the filter chip is mounted; a ground terminal provided in the laminated portion; a first U-shaped ground pattern provided on a first layer and coupled to the filter chip, the first layer being included in the laminated portion between the filter chip and the ground terminal; and a second U-shaped ground pattern provided on a second layer to substantially overlap the first U-shaped ground pattern and coupled to the first U-shaped ground pattern and the ground terminal, the second layer being included in the laminated portion between the first layer and the ground terminal. In accordance with the present invention, two U-shaped ground patterns are formed to substantially overlap each other. This increases the self-inductance of the line patterns. It is therefore possible to provide a filter to which the inductor can be applied and which can be downsized.

According to still another aspect of the present invention, preferably, there is provided a filter including: a filter chip; a laminated portion on which the filter chip is mounted; a ground terminal provided in the laminated portion; a first ground pattern provided on a first layer and coupled to the filter chip, the first layer being included in the laminated portion between the filter chip and the ground terminal; a second ground pattern provided on a third layer to substantially overlap the first ground pattern and coupled to the first ground pattern and the ground terminal, the third layer being included in the laminated portion between the first layer and the ground terminal; and an input/output pattern provided on a second layer to substantially overlap the first ground pattern and the second ground pattern and coupled to the filter chip and an input/output terminal, the second layer being included in the laminated portion between the first layer and the third layer. In accordance with the present invention, a capacitor having a great capacitance can be coupled in a small space. Accordingly, it is possible to provide a filter to which the capacitor is applied with ease and which can be downsized.

According to yet another aspect of the present invention, preferably, there is provided a duplexer including: a transmitting filter coupled to a transmitting terminal; a receiving filter coupled to a receiving terminal; a phase-matching circuit coupled to a common terminal, the transmitting terminal, and the receiving terminal to match phases of the transmitting filter and the receiving filter; and a laminated portion on which the phase-matching circuit is mounted. The transmitting filter and the receiving filter may respectively include any of the above-described filters. In accordance with the present invention, it is possible to provide a duplexer having a small insertion loss.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention. Embodiments 1 through 6 exemplarily describe examples of a filter and a duplexer having the filter. A receiving terminal and a transmitting terminal of the duplexer respectively correspond to an output terminal and an input terminal of the filter. An input/output terminal denotes a terminal that serves as an input terminal or an output terminal.

First Embodiment

Figure 1:
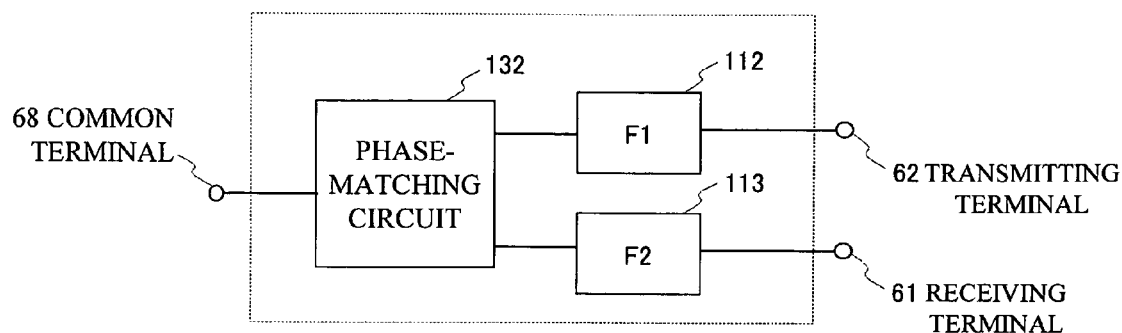
FIG. 1 is a block diagram of a duplexer in accordance with a first embodiment of the present invention.
Figure 2:
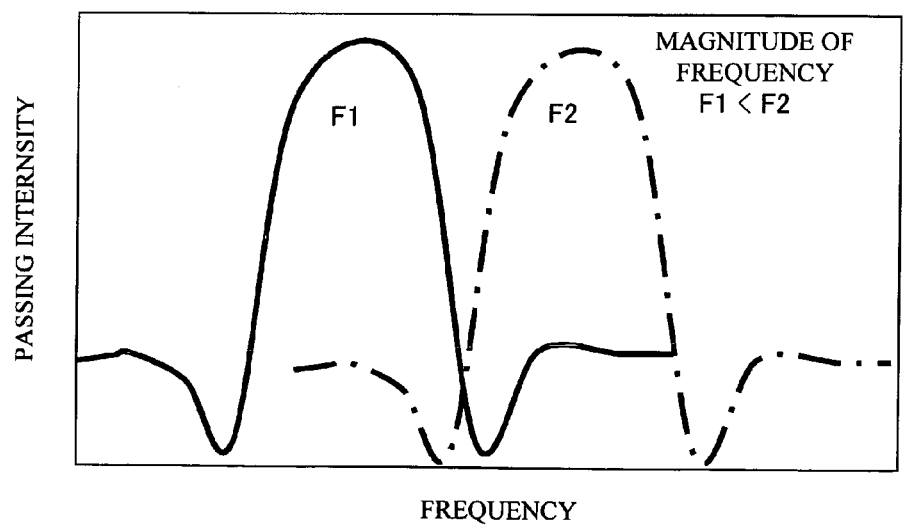
FIG. 2 shows passing intensities (higher as closer to the top) with respect to frequencies of the transmitting filter and the receiving filter (higher as closer to the right)
Figure 3:
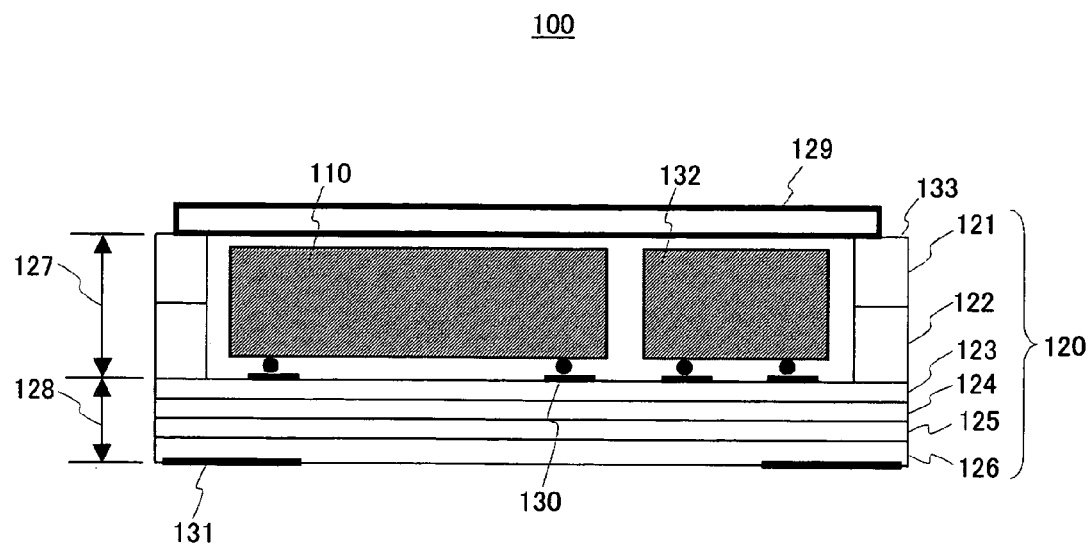
FIG. 3 is a cross-sectional view of a duplexer in accordance with the first embodiment of the present invention.
Figure 4:
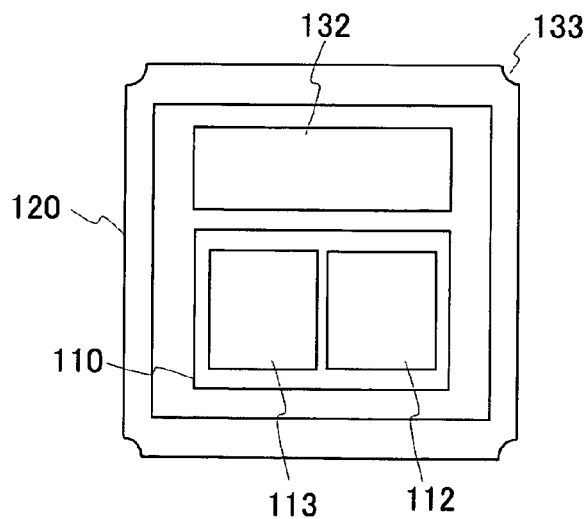
FIG. 4 is a top view of the duplexer in accordance with the first embodiment of the present invention from which a cap is removed.

A first embodiment of the present invention employs a filter mounted on a laminated package and a duplexer having the afore-mentioned filter. An inductor is connected in series with the receiving terminal (output terminal) and the transmitting terminal (input terminal) and an input/output pad (not shown) of a filter chip. FIG. 1 is a block diagram of the duplexer. FIG. 2 shows passing intensities (higher as closer to the top) with respect to frequencies of the transmitting filter and the receiving filter (higher as closer to the right). FIG. 3 is a cross-sectional view of the duplexer in accordance with the first embodiment. FIG. 4 is a top view of the duplexer from which a cap 129 is removed.

Referring now to FIG. 1, a transmitting signal is input from a transmitting terminal 62. The signal having a desired frequency passes through a transmitting filter 112 and a matching circuit 132, and is output from a common terminal 68. A received signal is input from the common terminal 68, and passes through the matching circuit 132. The signal having a desired frequency passes through a receiving filter 113, and is output from a receiving terminal 61. The common terminal 68 is provided for connecting an external circuit that sends and receives electric waves through an antenna. The transmitting terminal (input terminal) 62 is provided for connecting an external transmitting circuit so as to input a signal having a desired center frequency. The receiving terminal (output terminal) 61 is provided for connecting an external receiving circuit so as to output a signal having the desired center frequency.

Referring to FIG. 2, the transmitting filter 112 and the receiving filter 113 respectively have center frequencies, F1 and F2, of different passbands. Here, F2 is greater than F1. For instance, approximately 100 MHz is a difference in frequency between F1 and F2 on the duplexer of 1.9 GHz range.

Referring to FIG. 3, a duplexer 100 includes a laminated package 120, a filter chip 110, and a phase-matching circuit chip 132. The filter chip 110 includes the transmitting filter 112 and the receiving filter 113.

Referring to FIG. 4, the filter chip 110 is composed of the transmitting filter 112 and the receiving filter 113. The transmitting filter 112 is, for example, a ladder-type SAW filter in which one-port SAW resonators are connected in a ladder. The receiving filter 113 is, for example, a double-mode SAW filter.

The filter chip 110 is fabricated, for example, as follows. A piezoelectric crystal such as LiTaO$_3$ (for example, 42 degrees, Y-cut, X-propagation) is used as a substrate. A metal alloy having a main component of aluminum such as, for example, Al—Cu or Al—Mg and a multilayer film that includes aluminum, such as, for example, Al—Cu/Cu/Al—Cu, Al/Cu/Al, Al/Mg/Al, or Al—Mg/Mg/Al—Mg are formed by sputtering. A given pattern is formed by the commonly used exposure process and the etch process. In this manner, the filter chip 110 is completed.

The phase-matching circuit chip 132 is a chip on which a phase-matching circuit is provided. The phase-matching circuit is provided so that the transmitting filter 112 and the receiving filter 113 may not deteriorate the filter characteristics of each other. A characteristic impedance Z1 is the characteristic impedance, when the transmitting filter 112 is viewed from the common terminal 68. A characteristic impedance Z2 is the characteristic impedance, when the receiving filter 113 is viewed from the common terminal 68. If the frequency of the signal input from the common terminal 68 is matched with F1 by the action of the phase-matching circuit 132, the characteristic impedance Z1 of the transmitting filter 112 conforms to a characteristic impedance of the common terminal 68, the characteristic impedance of the receiving filter 113 is infinite, and a coefficient of reflection thereof is 1. If the frequency of the signal input from the common terminal 68 is matched with F2, the characteristic impedance of the transmitting filter 112 is infinite, a coefficient of reflection thereof is 1, and the characteristic impedance Z2 of the receiving filter 113 conforms to the characteristic impedance of the common terminal 68.

Referring to FIG. 3, the laminated package 120 includes six laminated layers 121 through 126, which includes a cap mounting layer 121, a cavity layer 122, a die attach layer 123, a first line pattern layer 124, a second line pattern layer 125, and a line pattern/footpad layer 126. The cap mounting layer 121 and the cavity layer 122 form a cavity forming layer 127. The die attach layer 123, the first line pattern layer 124, the second line pattern layer 125, and the line pattern/footpad layer 126 form a base layer (laminated portion) 128. The afore-described layers 121 through 126 are made of alumina ceramic or glass ceramic having approximately 8-9.5 of relative permittivity.

The cap 129 is mounted on the cap mounting layer 121 to seal a cavity in the cavity forming layer 127. The filter chip 110 and the phase-matching circuit chip 132 are face-down bonded on the die attach layer 123 with bumps 130. Footpads 131 are provided on a bottom surface of the line pattern/footpad layer 126. The footpads 131 have a functionality to connect with the outside as an input/output terminal, a connecting terminal, or a ground terminal. Connecting channels (side castellations, namely, grooves) 133 are provided on corners of the respective layers 121 through 126. A seal ring ground of the cap mounting layer 121 is connected to the footpad 131, which serves as a ground terminal, provided on the bottom surface of the line pattern/footpad layer 126, through the connecting channels 133. The outside dimension of the laminated package 120 is, for example, 3 mm×3.1 mm.

Figure 5A:
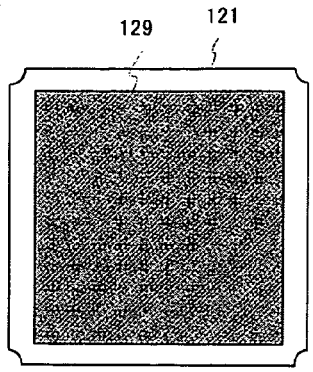
FIG. 5A through FIG. 5G respectively show layers in a laminated package of the duplexer in accordance with the first embodiment of the present invention.
Figure 5B:
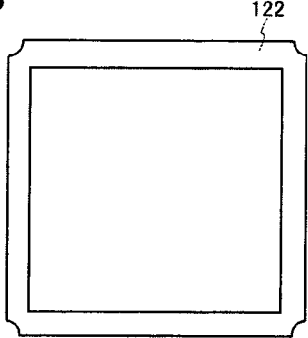
Figure 5C:
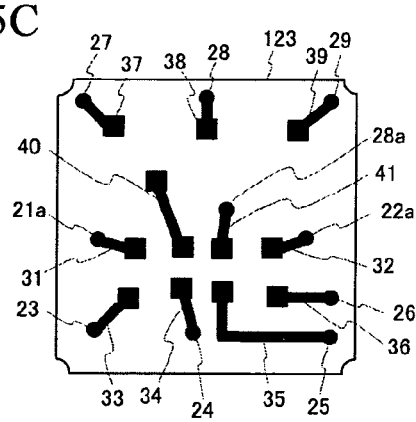
Figure 5D:
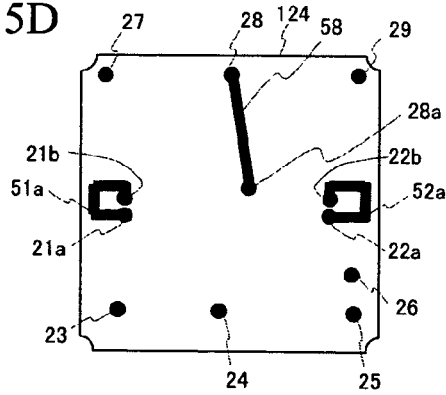
Figure 5E:
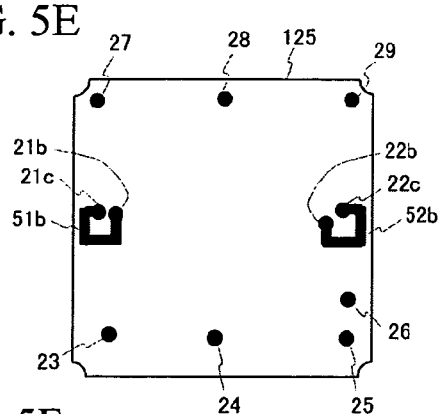
Figure 5F:
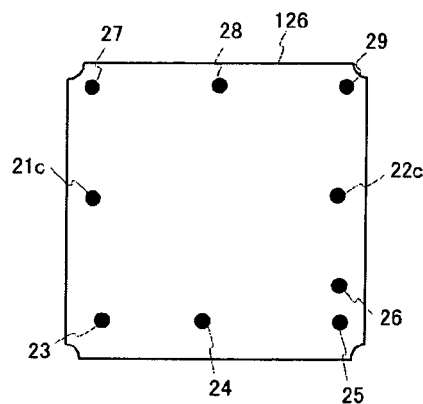
Figure 5G:
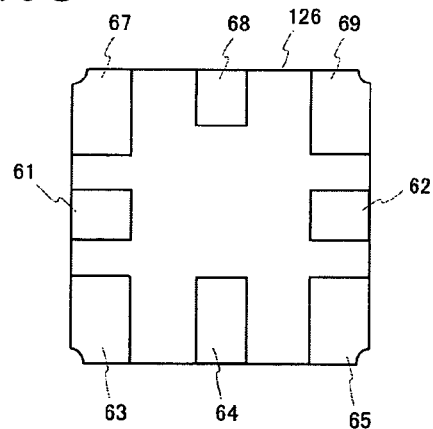

FIG. 5A through FIG. 5G show the respective layers of the laminated package 120 in accordance with the first embodiment of the present invention. FIG. 5A is a top view of the cap mounting layer 121. FIG. 5B is a top view of the cavity layer 122. FIG. 5C is a top view of the die attach layer 123. FIG. 5D is a top view of the first line pattern layer 124. FIG. 5E is a top view of the second line pattern layer 125. FIG. 5F is a top view of a top surface of the line pattern/footpad layer 126. FIG. 5G is a top view of the bottom surface of the line pattern/footpad layer 126. Herein, vias shown in the afore-described figures denote bores, holes, or receiving lands thereof in the layers.

Referring to FIG. 5A again, the cap 129 is mounted on a top surface of the cap mounting layer 121. Except the circumference, the cap mounting layer 121 is opened and a cavity is formed. Referring to FIG. 5B, except the circumference, the cavity layer 122 is opened and the cavity is formed.

Referring now to FIG. 5C, the die attach layer 123 has vias 23, 24, 25, 26, 27, 28, and 29 connected to the line pattern/footpad layer 126, and also has vias 21a, 22a, and 28a connected to the first line pattern layer 124. The vias 21a, 22a, 23, 24, 25, 26, 27, 28, 28a, and 29 are respectively connected to a line pattern for receiving 31, a line pattern for transmitting 32, a ground pattern for the receiving filter 33, a ground pattern for the receiving filter 34, a ground pattern for transmitting filter 35, a ground pattern for transmitting filter 36, a ground pattern for the phase-matching circuit 37, a line pattern for the common terminal 38, a line pattern for connecting the transmitting filter and a common terminal 41, and a ground pattern for the phase-matching circuit 39. In addition, a pattern 40 is provided for connecting the receiving filter and phase-matching circuit. In each of the afore-described patterns, square portions serve as the pads for forming the bumps 130 that connects the filter chip 110 or the phase-matching circuit chip 132.

Referring to FIG. 5D, the first line pattern layer 124 also has the vias 23, 24, 25, 26, 27, 28, and 29, which connect the die attach layer 123 through the line pattern/footpad layer 126. A first U-shaped line pattern 51a for receiving is provided between the via 21a connecting the die attach layer 123 and the via 21b connecting the second line pattern 125. A first U-shaped line pattern 52a for transmitting is provided between the via 22a connecting the die attach layer 123 and the via 22b connecting the second line pattern 125. A line pattern 58 for connecting the transmitting filter and the common terminal is provided between the via 28a connecting the die attach layer 123 and the via 28.

Referring to FIG. 5E, the second line pattern layer 125 also has the vias 23, 24, 25, 26, 27, 28, and 29, which connects the die attach layer 123 through the line pattern/footpad layer 126. A second U-shaped line pattern 51b for receiving is provided between the via 21b connecting the first line pattern layer 124 and the via 21c connecting the line pattern/footpad layer 126. A second U-shaped line pattern 52b for transmitting is provided between the via 22b connecting the first line pattern 124 and the via 22c connecting the line pattern/footpad layer 126.

Referring to FIG. 5F, the top surface of the line pattern/footpad layer 126 also has the vias 23, 24, 25, 26, 27, 28, and 29, which connects the die attach layer 123 through the line pattern/footpad layer 126, and has the vias 21c and 22c, which connects the second line pattern layer 125.

Referring to FIG. 5G, the bottom surface of the line pattern/footpad layer 126 has footpads 61 through 69. The footpad 61 serves as the receiving terminal (output terminal) 61 connected to the via 21c. The footpad 62 serves as the transmitting terminal (input terminal) 62 connected to the via 22c. The footpads 63, 64, 65, 67, and 69 respectively serve as the ground terminals 63, 64, 65, 67, and 69, which are respectively connected to the vias 23, 24, 25 and 26, 27, and 29. The footpad 68 serves as the common terminal 68 connected to the via 28.

The filter and duplexer 100 employed in the first embodiment includes the filter chip 110 and the base layer (laminated portion) 128 on which the filter chip 110 is mounted. The filter chip 110 includes the transmitting filter 112 and the receiving filter 113 of different frequency ranges. In addition, the filter and duplexer 100 employed in the first embodiment include the receiving terminal (output terminal) 61 and the transmitting terminal (input terminal) 62 provided on the base layer (laminated portion) 128, and also include the first U-shaped line patterns 51a and 52a, which are respectively coupled to the filter chip 110, and are formed on the first line pattern layer (a first layer) 124 of the base layer (laminated portion) 128 arranged between the filter chip 110 and the receiving terminal (output terminal) 61 and the transmitting terminal (input terminal) 62, preferably, between the first line pattern layer (first layer) 124 and the receiving terminal (output terminal) 61 and the transmitting terminal (input terminal) 62. The filter and duplexer 100 further includes second U-shaped line patterns 51b and 52b, which are formed on the second line pattern layer (second layer) 125 of the base layer (laminated portion) 128 arranged between the first line pattern layer (first layer) 124 and the receiving terminal (output terminal) 61 and the transmitting terminal (input terminal) 62, in such a manner that the second U-shaped line patterns 51b and 52b substantially overlap the first U-shaped line patterns 51a and 52a respectively. The second U-shaped line patterns 51b and 52b are respectively coupled to the first U-shaped line patterns 51a and 52a and the receiving terminal (output terminal) 61 and the transmitting terminal (input terminal) 62.

The duplexer 10 in accordance with the first embodiment further includes the transmitting filter 112 coupled to the transmitting terminal 62, the receiving filter 113 coupled to the receiving terminal 61, the common terminal 68, the phase-matching circuit 132 coupled to the transmitting filter 112 and the receiving filter 113 so as to match the phases of the transmitting filter 112 and the receiving filter 113, and the laminated portion 128 on which the phase-matching circuit 132 is mounted.

The phase-matching circuit 132 is mounted on the base layer (laminated portion) 128 that mounts the transmitting filter 112 and the receiving filter 113. That is to. say, the base layer (laminated portion) 128 having the phase-matching circuit 132 mounted thereon is commonly provided to the transmitting filter 112 and for the receiving filter 113 as the base layer (laminated portion) 128.

In the filter and the duplexer employed in the first embodiment as described above, an inductor created by the first U-shaped line pattern 51a and the second U-shaped line pattern 51b is connected in series with the receiving terminal (output terminal) 61 and an output pad of the filter chip 110. In addition, the inductor formed by the first U-shaped line pattern 52a and the second U-shaped line pattern 52b is connected in series with the transmitting terminal (input terminal) 62 and an input pad of the filter chip 110. The first U-shaped line patterns 51a and 52a are formed to substantially overlap the second U-shaped line patterns 51b and 52b respectively.

To substantially overlap the U-shaped line patterns denotes that the line patterns provided on different layers (for example, on the first line pattern layer 124 and on the second line pattern layer 125) of the base layer (laminated portion) 128 are arranged on almost same positions. This produces a greater inductance than the line patterns that are not overlapped. Accordingly, a great inductance as much as 1 nH-4 nH is available in the inductor connected in series with the receiving the receiving terminal (output terminal) 61, the transmitting terminal (input terminal) 62, even in an extremely small space. In this manner, it is possible to apply the inductor with ease in the impedance matching and downsize the laminated package 120, thereby enabling the filter and the duplexer to be downsized.

Figure 6A:
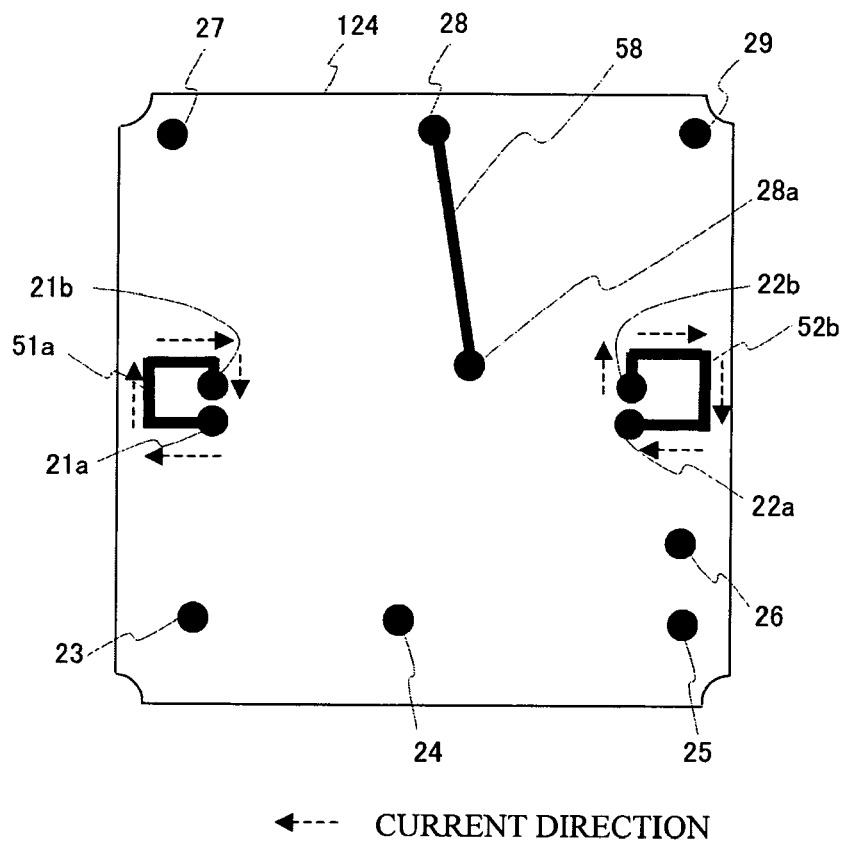
FIG. 6A and FIG. 6B show current directions of U-shaped line patterns in the duplexer in accordance with the first embodiment of the present invention.
Figure 6B:
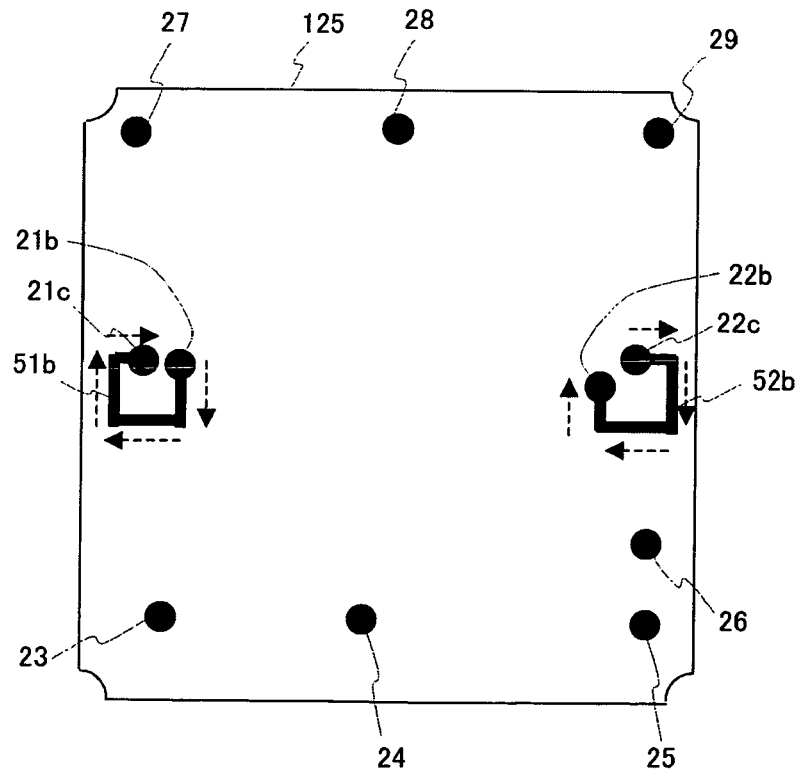

FIG. 6A shows the first line pattern layer 124 employed in the first embodiment. FIG. 6B shows the second line pattern layer 125 employed in the first embodiment. Reference numerals shown in FIG. 6A and FIG. 6B are same as those shown in FIG. 5D and FIG. 5E. Directions of dashed lines indicate the directions of current flow. Current flowing across the first U-shaped line patterns 51a and 52a has the substantially same direction as the current flowing across the second U-shaped line patterns 51b and 52b. In this manner, the self-inductance of the line pattern is significantly increased by making, for example, the current flows have substantially the same directions. Thus, a great inductance is obtainable in a small space, further downsizing the filter and the duplexer.

Next, a description will be given of a comparative example 1 in order to compare with the first embodiment. FIG. 7A through FIG. 7D show respective layers of the laminated package 120 of the comparative example 1. The layers that are not shown in FIG. 7A through FIG. 7D have the same configuration as those shown in FIG. 5A through FIG. 5G. In the die attach layer shown in FIG. 7A, a via 21 corresponds to the via 21a shown in FIG. 5C, and a via 22 corresponds to the via 22a shown in FIG. 5C. The other components and configurations as those shown in FIG. 7A have the same reference numerals as shown in FIG. 5C.

Figure 7A:
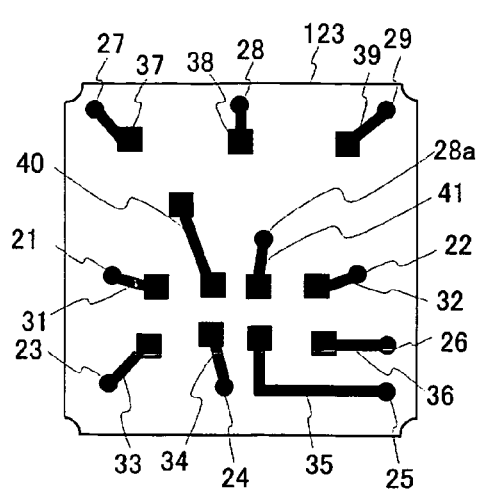
FIG. 7A through FIG. 7D respectively show layers in the laminated package of the duplexer of a comparative example 1.
Figure 7B:
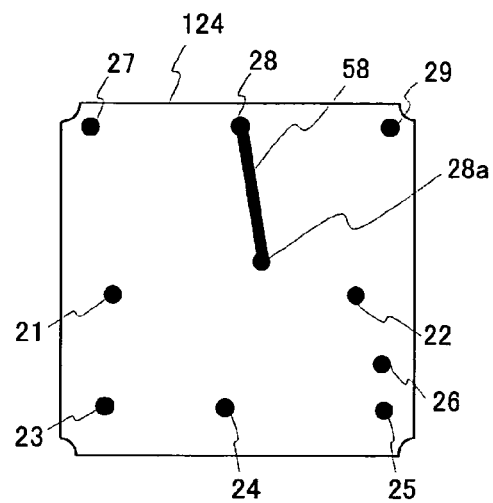

Referring to FIG. 7B, on the first line pattern layer 124, there are provided the via 21 and the via 22. The via 21 connects the die attach layer 123 through the line pattern/footpad layer 126. The via 22 connects the die attach layer 123 through the line pattern/footpad layer 126. The line pattern 58 for connecting the transmitting filter and the common terminal is also provided.

Figure 7C:
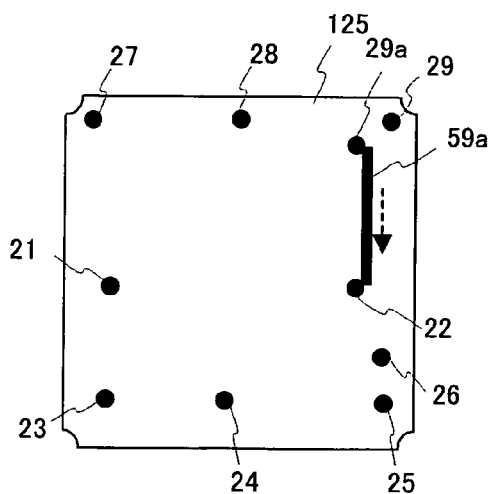

Referring to FIG. 7C, on the second line pattern layer 125, a via 29a is provided and connected to the line pattern/footpad layer 126, and a linearly-arranged line pattern 59a for transmitting is also provided between the via 29a and the via 22. Here, the via 22 shown in FIG. 7C is a receiving land, instead of a bore or hole, on the second line pattern layer 125.

Figure 7D:
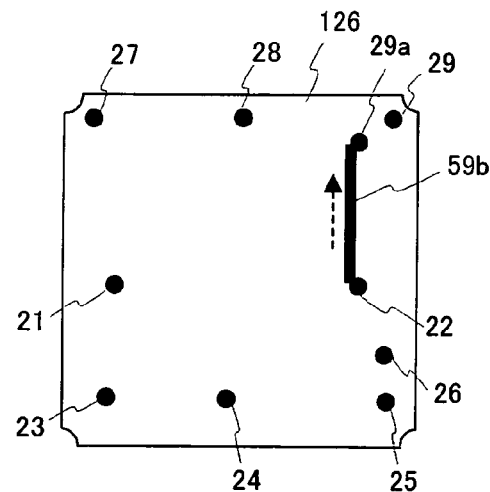

Referring now to FIG. 7D, on the top surface of the line pattern/footpad layer 126, a linearly-arranged line pattern 59b for transmitting is provided between the via 29a and the via 22. Here, the via 29a shown in FIG. 7D is a receiving land, instead of a bore or hole, on the line pattern/footpad layer 126. Current flows across the line patterns 59a and 59b for transmitting respectively, as indicated by arrows.

As described, according to the comparative example 1, the linearly-arranged line patterns 59a and 59b are formed to serves as the inductors, instead of the U-shaped line patterns 52a and 52b. The evaluations to be described below have been carried out on the transmitting filter 112. The inductor used in the comparative example 1 is provided only for the transmitting terminal 62. In the comparative example 1, the line patterns are formed longer to obtain the same inductance as the first embodiment. This increases capacitive components with the ground.

Figure 8A:
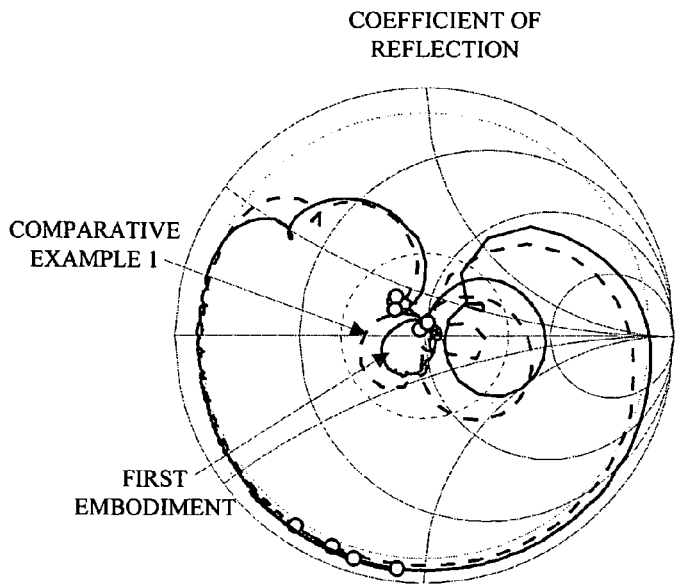
FIG. 8A through FIG. 8C are graphs showing the characteristics of a transmitting filter used in the first embodiment and a comparative example 1.
Figure 8B:
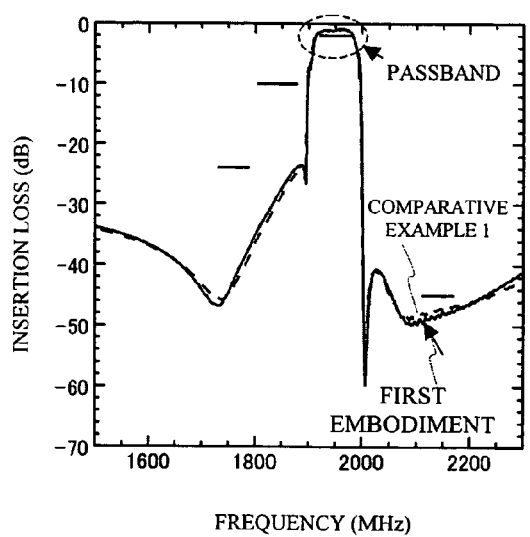
Figure 8C:
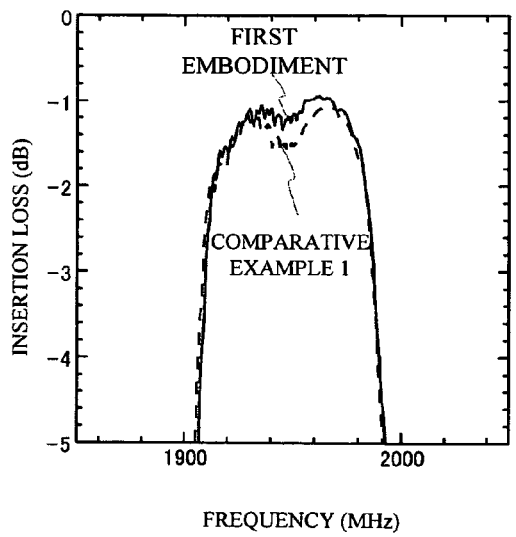

FIG. 8A through FIG. 8C show evaluation results. FIG. 8A through FIG. 8C are graphs showing the characteristics of the transmitting filter 112 used in the first embodiment and that used in the comparative example 1. Reflection characteristics shown in FIG. 8A exhibit that the passband in the comparative example 1 is deviated from the center and there is a capacitive characteristic, around a tip of an arrow of the comparative example 1. That is to say, there is a large capacitive component with the ground. In contrast, the passband in the first embodiment is closer to the center, around a tip of an arrow of the first embodiment. That is to say, there is a small capacitive component with the ground. FIG. 8B shows frequency and insertion loss. FIG. 8C is an enlarged view around the passband. The transmitting filter 112 used in the first embodiment has a smaller insertion loss than that used in the comparative example 1. Also, FIG. 8B exhibits that there is no degradation in suppression in the frequency range except for the passband in the transmitting filter 112 used in the first embodiment, unlike the transmitting filter 112 used in the comparative example 1. In this manner, in accordance with the first embodiment, the inductance having a small capacitive component can be applied to the transmitting terminal (input terminal) or the receiving terminal.(output terminal), thereby making it possible to provide the filter in which the insertion loss is small.

The U-shaped line patterns 51*a*, 52*a*, 51*b*, and 52*b* are formed to have a half loop shape, and the first U-shaped line pattern and the second U-shaped line pattern provided for transmitting and receiving respectively may substantially overlap. Other examples of the shape thereof are shown in FIG. 9A through FIG. 10B. In FIG. 9A through FIG. 10B, a via 90 connects the die attach layer 123 and the first line pattern 124. Vias 91 and 92 connect the first line pattern layer 124 and the second line pattern 125. A via 93 connects the second line pattern layer 125 and the ling pattern/footpad layer 125. A first line pattern 95 is formed between the via 90 and the via 91. A second line pattern 96 is formed between the via 92 and the via 93. The via 92 and the via 93 are vias that are connected. The current direction is indicated by an arrow in each figure.

Figure 9A:
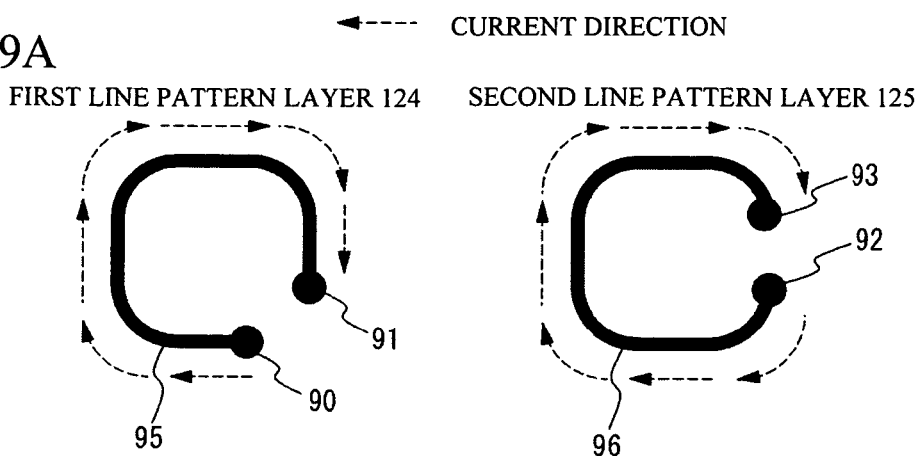
FIG. 9A through FIG. 9D show variation examples of the U-shaped line pattern.
Figure 9B:
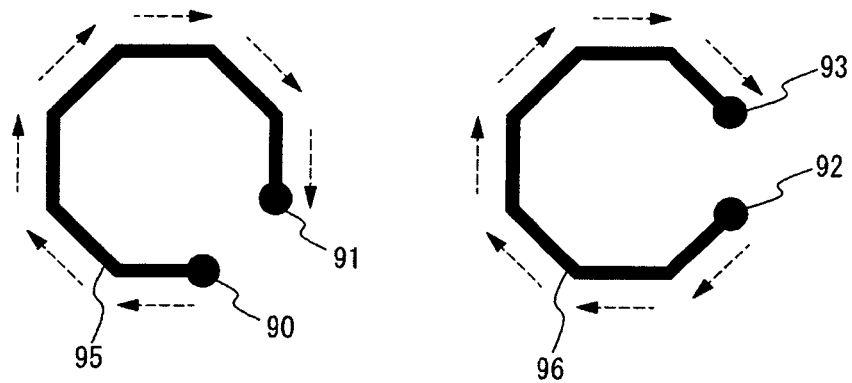
Figure 9C:
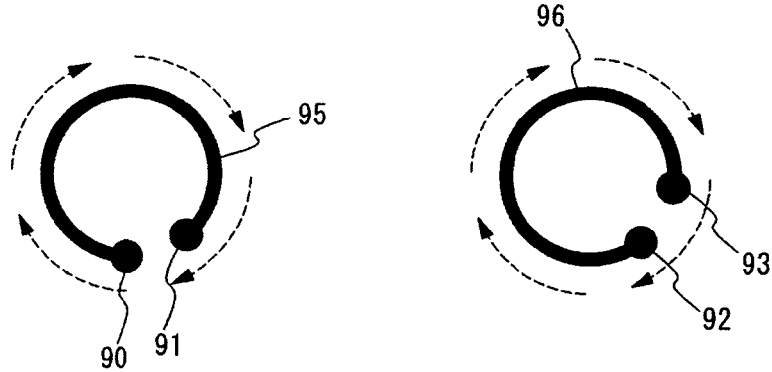
Figure 9D:
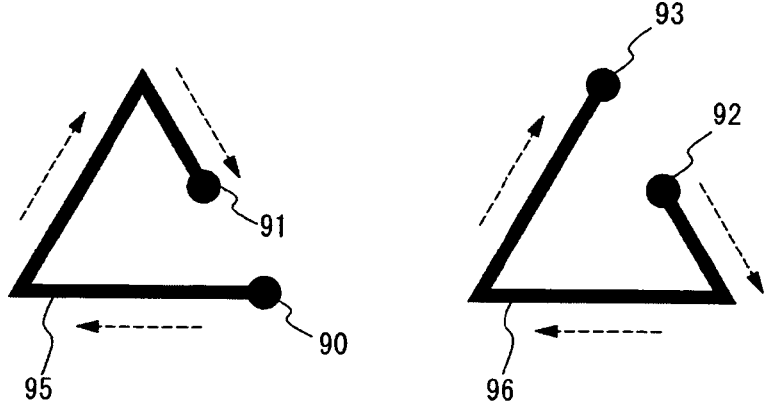
Figure 10A:
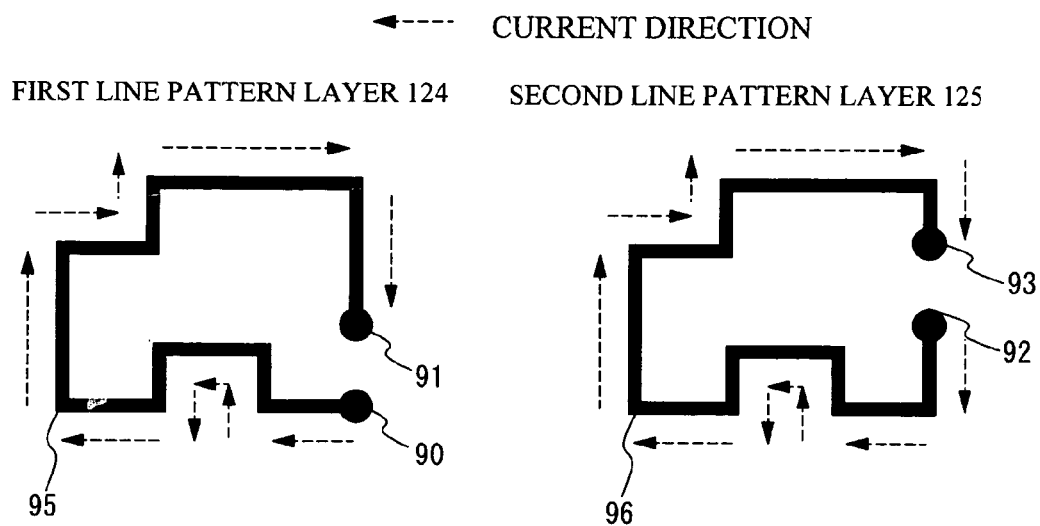
FIG. 10A and FIG. 10B show other variation examples of the U-shaped line pattern.
Figure 10B:
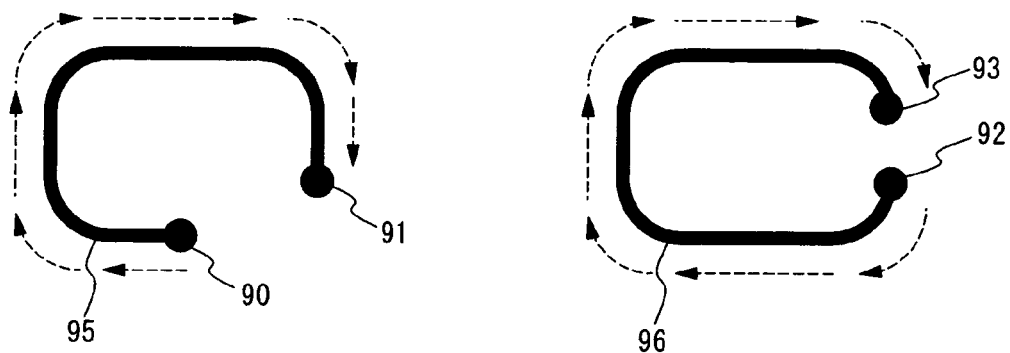

FIG. 9A shows an example of the half loop shape made of a square, in which corners are rounded. FIG. 9B shows an example of the half loop shape made of a polygon. FIG. 9C shows an example of the half loop shape made of a circle. FIG. 9D shows an example of the half loop shape made of a triangle. FIG. 10A shows an example of the half loop shape made of a polygon having inner angles of less than 180 degrees and outer angles of more than 180 degrees. FIG. 10B shows an example of the half loop shape made of an oval. As described, the U-shaped line pattern only has to have a half loop shape.

As described above, in accordance with the first embodiment, the first U-shaped line pattern 51*a* and the second U-shaped line patterns 51*b* are provided in such a manner that they substantially overlap each other and have the same direction of the current flow, and the first U-shaped line pattern 52*a* and the second U-shaped line patterns 52*b* are provided in such a manner that they substantially overlap each other and have the same direction of the current flow. This enables the self-inductance of the line pattern to be greater, thereby reducing the size of the laminated portion and resulting in the downsized filter and duplexer. It is also possible to provide the filter and the duplexer having a small insertion loss, to which the capacitive component is difficult to be applied.

Second Embodiment

Figure 11A:
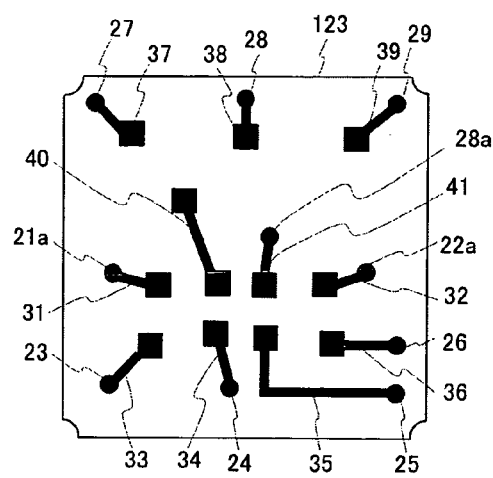
FIG. 11A through FIG. 11D respectively show the layers in the laminated package of the duplexer in accordance with a second embodiment of the present invention.
Figure 11B:
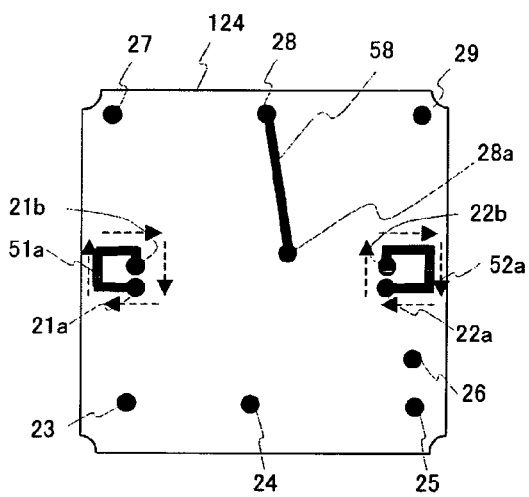
Figure 11C:
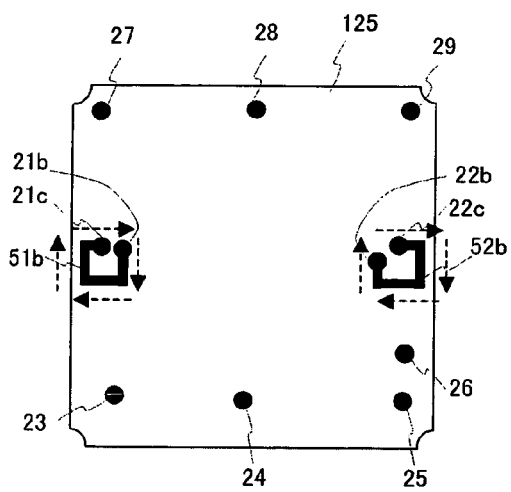
Figure 11D:
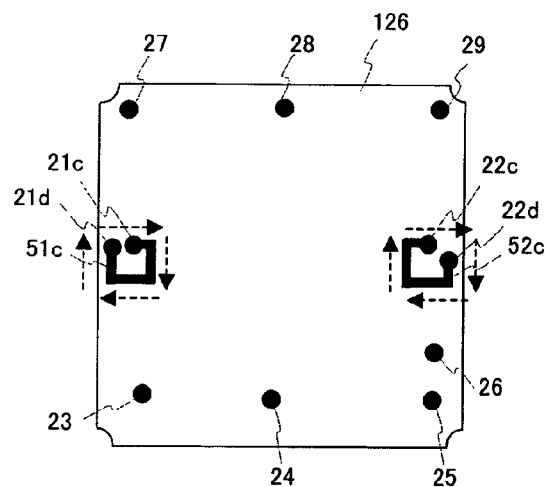

A second embodiment of the present invention employs the U-shaped line pattern provided in three or more layers, and the inductor is connected in series with the receiving terminal (output terminal) and transmitting terminal (input terminal) and the input/output pad (not shown) of the filter chip 110. FIG. 11A through FIG. 11D show respective layers of the laminated package 120 used in the second embodiment. The layers that are not shown in FIG. 11A through FIG. 11D have the same configuration as corresponding layers shown in FIG. 5A through 5G. The die attach layer 123 shown in FIG. 11A, the first line pattern layer 124 shown in FIG. 11B, and the second line pattern layer 125 shown in FIG. 11C are same as those shown in FIG. 5A through FIG. 5G employed in the first embodiment. There are provided vias 21*d* and 22*d* on the top surface of the line pattern/footpad layer 126. The vias 21*d* and 22*d* are connected to the bottom surface of the line pattern/footpad layer 126. A third U-shaped line patterns 51*c* and 52*c* are respectively formed between the via 21*c* and the via 21*d* and between the via 22*c* and the via 22*d*.

In accordance with the second embodiment, there are provided the third U-shaped line patterns 51*a* and 52*c*, which are formed in one or more layers of the base layer (laminated portion) 128 that between the first line pattern layer (first layer) 125 and the receiving terminal (output terminal) 61 and the transmitting terminal (input terminal) 62, in such a manner that the current flowing across the third U-shaped line pattern 51*c* substantially has the same direction as the current flowing across the first U-shape line pattern 51*a* and the second U-shape line patterns 51*b*, and the third U-shaped line pattern 52*c* substantially has the same direction as the current flowing across the first U-shaped line pattern 52*a* and the second U-shape line patterns 52*b*. In this manner, another U-shaped line pattern provided for overlapping the U-shaped line patterns increases the inductance of the inductor connected in series with the receiving terminal (output terminal) 61 and the transmitting terminal (input terminal) 62 and the input/output pad (not shown) of the filter chip 110. Accordingly, even if large impedance is required for the impedance matching, the laminated portion can be downsized, thereby downsizing the filter and the duplexer, same as the first embodiment. It is also possible to provide the filter and the duplexer to which the capacitive component is hardly applied and which has a small insertion loss. In addition, the inductor having larger inductance can be formed by laminating the layers having the U-shaped line patterns.

In the first and second embodiments, it is possible to respectively form the first U-shaped line patterns 51*a* and 52*a*, the second U-shaped line patterns 51*b* and 52*b*, or the third U-shaped line patterns 51*c* and 52*c*, so as to substantially overlap the receiving terminal (output terminal) 61 or the transmitting terminal (input terminal) 62. This can reduce the capacitance to be applied between the U-shaped line patterns and the ground, reducing the insertion loss.

In addition, it is possible to respectively form the first U-shaped line patterns 51*a* and 52*a*, the second U-shaped line patterns 51*b* and 52*b*, or the third U-shaped line patterns 51*c* and 52*c* so as not to overlap the ground terminals in the base layer (laminated portion) 128. This can reduce the capacitance to be applied between the U-shaped line patterns and the ground, reducing the insertion loss.

Furthermore, it is possible to form the first U-shaped line patterns 51*a* and 52*a*, the second U-shaped line patterns 51*b* and 52*b*, or the third U-shaped line patterns 51*c* and 52*c* to respectively have a distance between the lines larger than a line width. Here, the distance between the lines denotes a distance between the lines in the U-shaped line pattern, and the line width denotes a width of a line. If the distance between the lines is smaller than the line width, the current flowing in opposite directions across opposing corners cancels each other and the inductance cannot be increased. Accordingly, the inductance of the U-shaped line pattern can be increased by making the distance between the lines greater than the line width, thereby reducing the sizes of the filter and the duplexer.

In the first and second embodiments, the inductance is applied to the receiving terminal (output terminal) and the transmitting terminal (input terminal). The inductance may be applied to either the receiving terminal (output terminal) or the transmitting terminal (input terminal), according to the need that the inductance is applied and the impedance is matched.

Third Embodiment

Figure 12A:
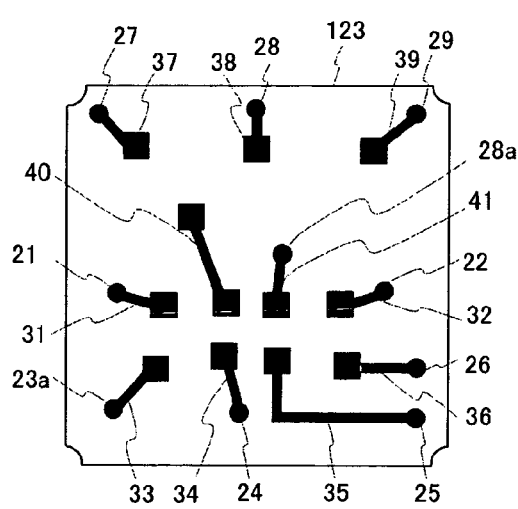
FIG. 12A through FIG. 12D respectively show the layers in the laminated package of the duplexer in accordance with a third embodiment of the present invention.

A third embodiment of the present invention exemplarily employs the inductor connected in series with the ground terminal and a ground pad (not shown) of the filter chip 110. The layers that are not shown in FIG. 12A through FIG. 12D have the same configuration as those shown in FIG. 5A through FIG. 5G used in the first embodiment. The via 21 corresponds to the via 21a shown in FIG. 5C, the via 22 corresponds to the via 22a shown in FIG. 5C, and a via 23a corresponds to the via 23 shown in FIG. 5C. The other components and configurations as those shown in FIG. 12A have the same reference numerals as shown in FIG. 5C.

Figure 12B:
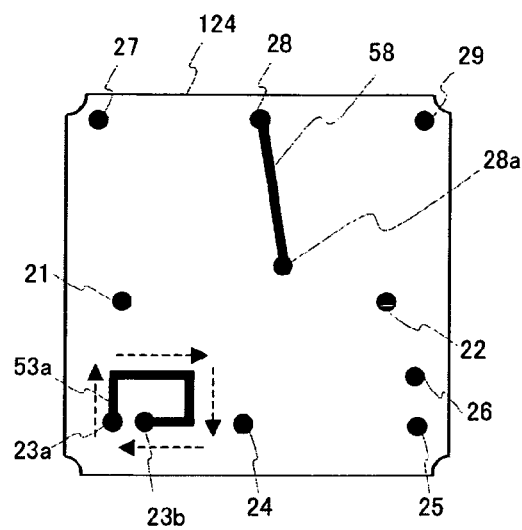

Referring to FIG. 12B, on the first line pattern layer 124, there is provided a first U-shaped ground pattern 53a formed between the via 23a connected to the die attach layer 123 and the via 23b connected to the second line pattern layer 125.

Figure 12C:
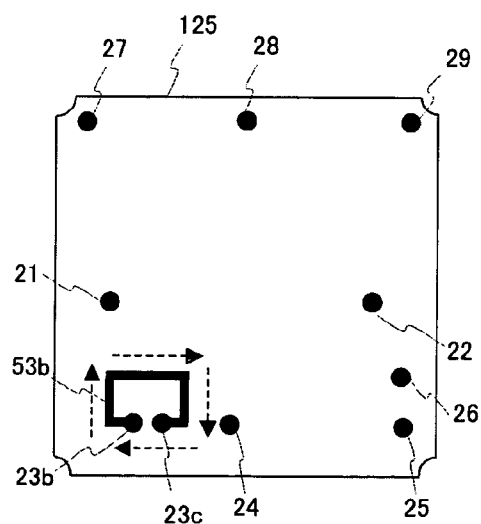
Figure 12D:
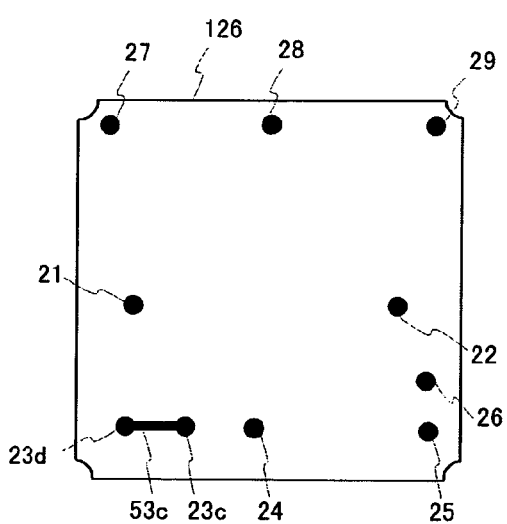

Referring to FIG. 12C, on the second line pattern layer 125, there is provided a second U-shaped ground pattern 53b between the via 23b connected to the first line pattern layer 124 and the via 23c connected to the top surface of the line pattern/footpad layer 126. Referring to FIG. 12D, on the top surface of the line pattern/footpad layer 126, a ground pattern 53c for receiving filter is provided between the via 23c connected to the second line pattern layer 125 and the via 23d connected to the bottom surface of the line pattern/footpad layer 126.

The filter and the duplexer 100 used in the third embodiment of the present invention includes the filter chip 110, the base layer (laminated portion) 128 on which the filter chip 110 is mounted, and the ground terminal 63 provided on the base layer (laminated portion) 128. The filter and the duplexer 100 used in the third embodiment of the present invention further includes the first U-shaped ground pattern 53a, which is provided on the first line pattern (first layer) 124 in the base layer (laminated portion) 128 between the filter chip 110 and the ground terminal 63, and which is coupled to the filter chip 110. In addition, the filter and the duplexer 100 used in the third embodiment of the present invention further includes the second U-shaped ground pattern 53b, which is provided on the second line pattern layer (second layer) 125 in the base layer (laminated portion) 128 between the first line pattern layer (first layer) 124 and the ground terminal 63 to substantially overlap the first U-shaped ground pattern 53a, and which is coupled to the first U-shaped ground pattern 53a and the ground terminal 63. Furthermore, the filter and the duplexer 100 used in the third embodiment of the present invention further includes the linearly-arranged ground pattern 53c, which is provided for substantially overlapping a portion of the first U-shaped ground pattern 53a and a portion of the second U-shaped ground pattern 53b on the top surface of the line pattern/footpad layer 126 in the base layer (laminated portion) 128 between the first line pattern (first layer) 124 and the ground terminal 63.

The filter and the duplexer used in the third embodiment of the present invention has the afore-described configuration, and is configured in such a manner that the inductor composed of the first U-shaped ground pattern 53a, the second U-shaped ground pattern 53b, and the linearly-arranged ground pattern 53c are connected in series with the ground terminal 63 and the ground pad of the filter chip 110, and the first U-shaped ground pattern 53a, the second U-shaped ground pattern 53b, and the linearly-arranged ground pattern 53c are substantially overlapped. Accordingly, a great inductance is available in the inductor connected in series with the ground terminal 63 and the filter chip 110 even in a very small space. This enables the laminated package 120 to be downsized. In particular, it is preferable that a large self-inductance is provided on the ground to reduce the suppression in the lower frequency range of the passband, in a mobile telephone system where the transmitting range and the receiving range are different, such as W-CDMA. Therefore, the filter and the duplexer can be downsized by employing the filter and the duplexer used in the third embodiment for the afore-described system.

As described in the first embodiment, it is possible to make the current flowing across the first U-shaped ground pattern 53a, the current flowing across the second U-shaped ground pattern 53b, and current flowing across the linearly-arranged ground pattern 53c substantially have the same direction. This can increase the self-inductance, thereby further downsizing the filter and the duplexer.

As described in the second embodiment, it is possible to provide a third U-shaped ground pattern on one or more layers in the base layer (laminated portion) 128 between the second line pattern layer (second layer) 124 and the ground terminal 63, for example, on the top surface of the line pattern/footpad layer 126. The third U-shaped ground pattern is coupled to the second U-shaped ground pattern 53b and the ground terminal 63 to substantially have the same current direction as the current flowing across the second U-shaped ground pattern 53b. This makes it possible to further downsize the filter and the duplexer. It is also possible to form the inductor having a greater inductance by laminating a layer having a U-shaped ground pattern.

In addition, it is also possible to provide the first U-shaped ground pattern 53a, the second U-shaped ground pattern 53b, or a third U-shaped ground pattern, so as not to overlap an inductive pattern in the base layer (laminated portion) 128. The inductive pattern denotes, for example, a pattern connected to the receiving terminal (output terminal) 61, the transmitting terminal (input terminal) 62, or the common terminal 68. Specifically, the first U-shaped line pattern, the second U-shaped line pattern, the third U-shaped line pattern. In fifth and sixth embodiments, input/output patterns 50 and 51g are also the inductive patterns. In this manner, it is possible to reduce the capacitance applied between the receiving terminal (output terminal) 61 or the transmitting terminal (input terminal) 62 and the ground, thereby reducing the insertion loss.

In the third embodiment, the inductor is coupled to the ground terminal of the receiving terminal (output terminal), yet it is possible to couple the inductor to the ground terminal of the transmitting terminal (input terminal), according to the need that the inductance should be applied. It is also possible to couple the inductors to both ground terminals of the receiving terminal (output terminal) and the transmitting terminal (input terminal).

Fourth Embodiment

Figure 13A:
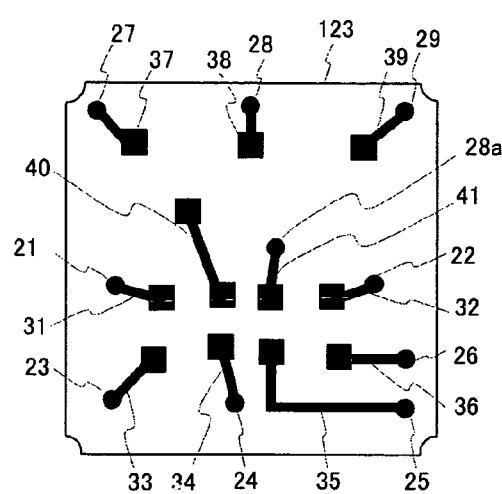
FIG. 13A through FIG. 13D respectively show the layers in the laminated package of the duplexer in accordance with a fourth embodiment of the present invention.

A fourth embodiment of the present invention employs a capacitor connected between the ground terminal 63 and the receiving terminal (output terminal) 61. FIG. 13A though FIG. 13D show respective layers of the laminated package 120 in accordance with the fourth embodiment of the present invention. The layers that are not shown in FIG. 13A through FIG. 13D have the same configuration as those shown in FIG. 5A through FIG. 5G. In the die attach layer shown in FIG. 13A, the via 21 corresponds to the via 21a shown in FIG. 5C, and the via 22 corresponds to the via 22a shown in FIG. 5C. The other components and configurations as those shown in FIG. 13A have the same reference numerals as shown in FIG. 5C described in the first embodiment.

Figure 13B:
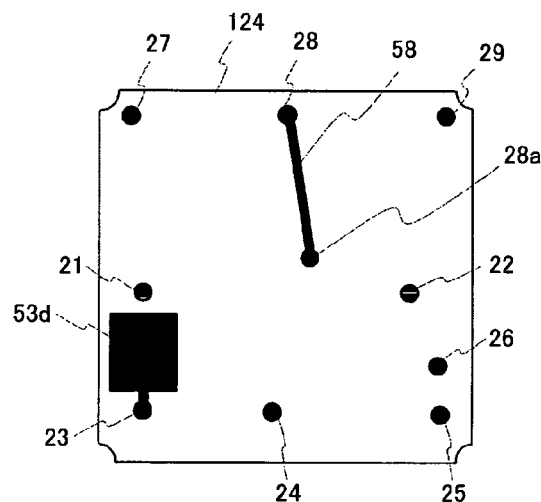
Figure 13C:
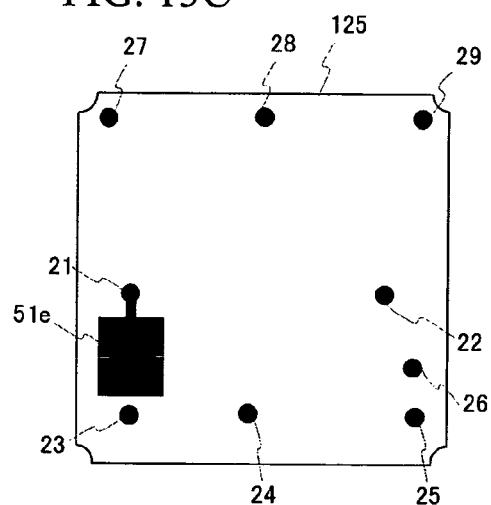
Figure 13D:
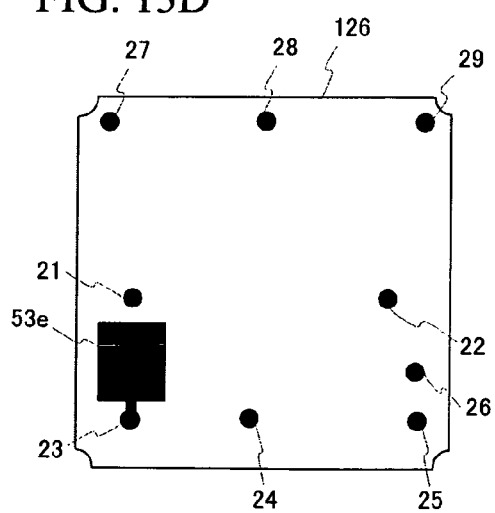
Figure 14A:
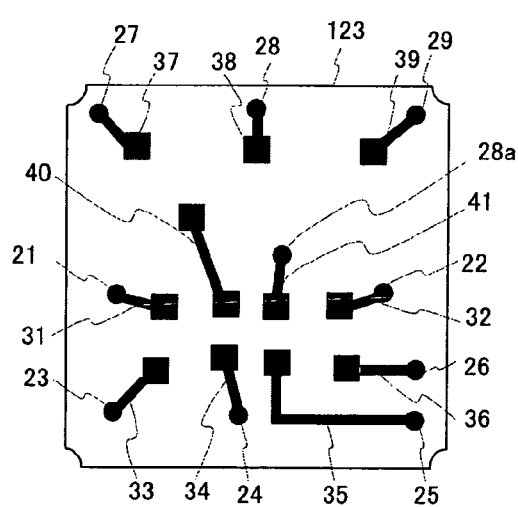
FIG. 14A through FIG. 14D respectively show the layers in the laminated package of a comparative example 2.
Figure 14B:
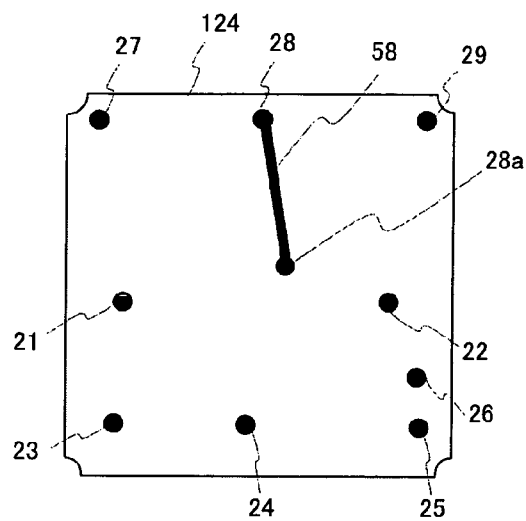
Figure 14C:
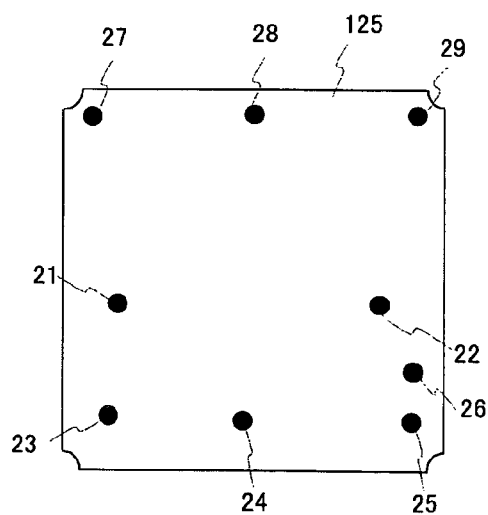
Figure 14D:
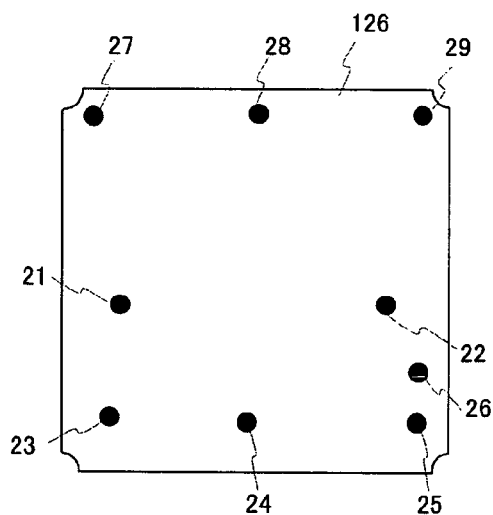

Referring to FIG. 13B, on the first line pattern layer 124, a first ground pattern 53d is provided and connected with the via 23, which is coupled to the ground terminal 63. Referring to FIG. 13C, an input/output pattern 51e is provided and connected with the via 21, which is coupled to the receiving terminal (output terminal) 61. Referring to FIG. 13D, a second ground pattern 53e is provided and connected with the via 23, which is coupled to the ground terminal 63.

The filter and the duplexer 100 employed in the fourth embodiment includes the filter chip 110, the base layer (laminated portion) 128 on which the filter chip 110 is mounted, and the ground terminal 63 provided on the base layer (laminated portion) 128. The filter and the duplexer 100 used in the fourth embodiment also includes the first ground pattern 53d, which is coupled to the filter chip 110 and provided on the first line pattern layer (first layer) 124 of the base layer (laminated portion) 128 between the filter chip 110 and the ground terminal 63. The filter and the duplexer 100 used in the fourth embodiment further includes the second ground pattern 53e and the input/output pattern 51e. The second ground pattern 53e is provided on a third layer in the base layer (laminated portion) 128 between the first line pattern layer (first layer) 124 and the ground terminal 63 so as to overlap the first ground pattern 53d. The input/output pattern 51e is provided on the second layer 125 between the first layer 124 and the third layer 126 in the laminated portion 128 so as to overlap the second ground pattern 53e, and is coupled to the filter chip 110 and the receiving terminal (output terminal) 61.

To overlap the ground pattern or the input/output pattern denotes that the patterns provided on different layers of the base layer (laminated portion) 128, for example, on the first line pattern layer 124 and the second line pattern layer 125, are located on almost same positions. This creates capacitors between the first ground pattern 53d and the input/output pattern 51e and between the input/output pattern 51e and the second ground pattern 53e. In other words, capacitors are coupled between the ground terminal and the receiving terminal (output terminal) 61. Accordingly, it is possible to connect a great capacitor in a small space of the filter and duplexer in accordance with the fourth embodiment of the present invention. This enables the laminated portion to be downsized, thereby downsizing the filter and the duplexer.

A description will now be given of a comparative example 2 to compare with the duplexer used in the fourth embodiment. The duplexer of the comparative example 2 does not include a capacitor between the ground terminal and the receiving terminal (output terminal) 61. FIG. 14A through FIG. 14D show respective layers of the laminated package 120 of the comparative example 2. The layers that are not shown in FIG. 14A through FIG. 14D have the same configuration as those shown in FIG. 5A through FIG. 5G. The first ground pattern 53d is not provided on the first line pattern layer 124 in FIG. 14B. The input/output pattern 51e is not provided on the second line pattern 125 in FIG. 14C. The second ground pattern 53e is not provided on the top surface of the line pattern/footpad layer 126 in FIG. 14D. In the comparative example 2, the other components and configurations have the same reference numerals as shown in FIG. 13A through FIG. 13D described in the fourth embodiment.

Figure 15A:
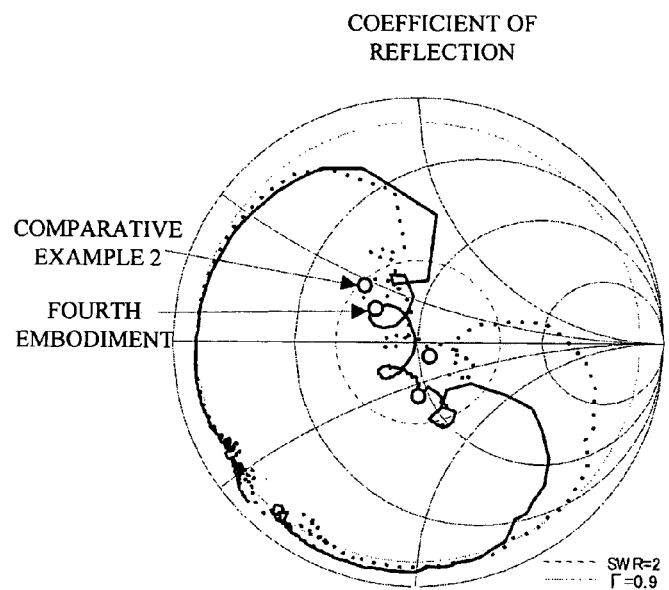
FIG. 15A through FIG. 15C are graphs showing the characteristics of a receiving filter used in the fourth embodiment and the comparative example 2.
Figure 15B:
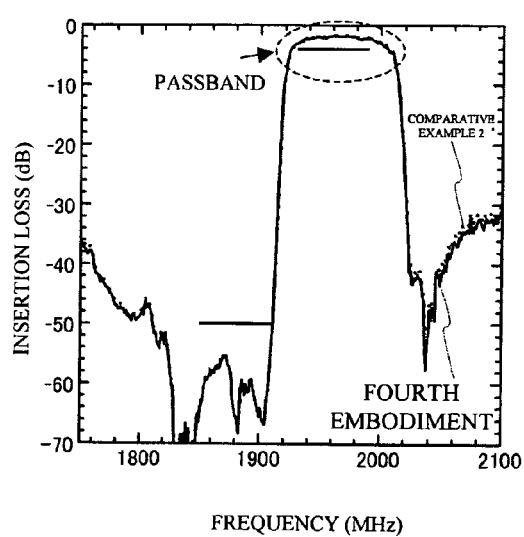
Figure 15C:
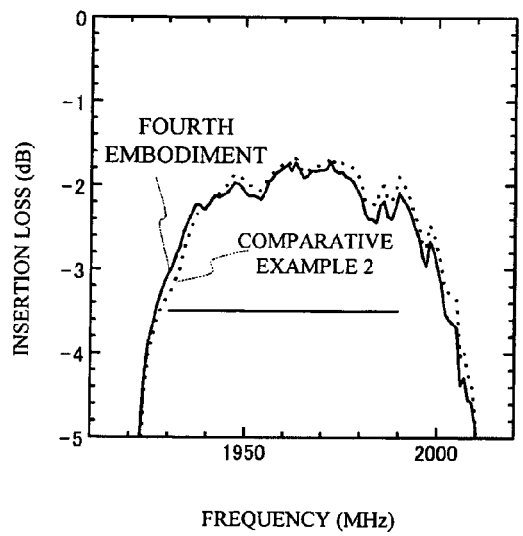

FIG. 15A through FIG. 15C are graphs showing the characteristics of the receiving filter 113 used in the fourth embodiment and in the comparative example 2. FIG. 15A shows reflection characteristic. FIG. 15B shows frequency and insertion loss. FIG. 15C is an enlarged view around the passband. With respect to the comparative example 2, FIG. 15A exhibits that the lower frequency of the passband is located at the upper left from the center (around tip of an arrow of the comparative example 2), and has an inductive characteristic. On the other hand, with respect to the fourth embodiment, FIG. 15A exhibits that the lower frequency of the passband is closer to the center (around tip of an arrow of the fourth embodiment), and moves to a capacitive characteristic from the inductive characteristic, improving the impedance matching. As a result, as shown in FIG. 15C, the insertion loss is improved in the lower frequency of the passband in the fourth embodiment. FIG. 15B exhibits that there is no degradation in suppression in the frequency range except for the passband in the fourth embodiment, as compared to the comparative example 2. As described heretofore, in accordance with the fourth embodiment, a capacitor can be coupled between the receiving terminal (output terminal) or the transmitting terminal (input terminal) and the ground terminal. This facilitates the impedance matching. It is also possible to provide a filter having a small insertion loss.

The second ground pattern 53e may also serves as the ground terminal 63. This eliminates one layer, and thereby enabling the filter and the duplexer to be downsized and reduced in cost.

The first ground pattern 53d or the second ground pattern 53e may be provided so as not to overlap the receiving terminal (output terminal) 61 or the transmitting terminal (input terminal) 62 in the laminated portion 128. This makes it possible to reduce the capacitance applied between the ground pattern and receiving terminal (output terminal) 61 or the transmitting terminal (input terminal) 62, thereby reducing the insertion loss.

In addition, the input/output pattern 51e may have a smaller area than the area of at least one of the first ground pattern 53d and the second ground pattern 53e. This enables the input/output pattern 51e to be provided between the first ground pattern 53d and the second ground pattern 53e for sure, even if the layers are misaligned in the fabrication process of the base layer (laminated portion) 128. This makes it possible to reduce the variation in the production of the capacitance.

Fifth Embodiment

A fifth embodiment of the present invention employs an inductor connected in series with the receiving terminal (output terminal) 61 and the output pad of the filter chip 110 and a capacitor coupled between the ground terminal 63 and the receiving terminal (output terminal) 61. FIG. 16A through FIG. 16D show respective layers of the laminated package 120 used in the fifth embodiment of the present invention. The layers that are not shown in FIG. 16A through FIG. 16D have the same configuration as those shown in FIG. 5A through FIG. 5G used in the first embodiment. In the die attach layer 123 shown in FIG. 16A, a via 21f corresponds to the via 21a in FIG. 5C, and the via 22 corresponds to the via 22a in FIG. 5C. The other components and configurations as those shown in FIG. 16A have the same reference numerals as shown in FIG. 5C.

Figure 16A:
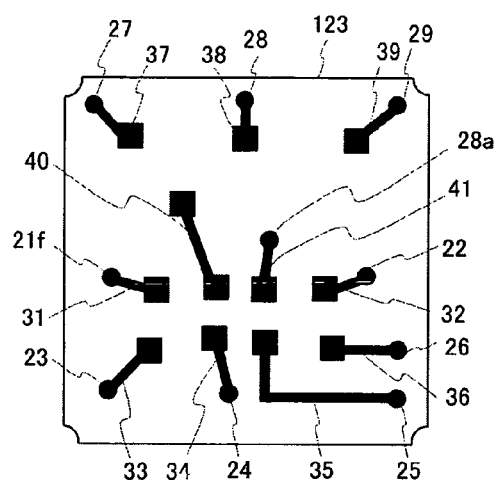
FIG. 16A through FIG. 16D respectively show the layers in the laminated package of the duplexer in accordance with a fifth embodiment of the present invention.
Figure 16B:
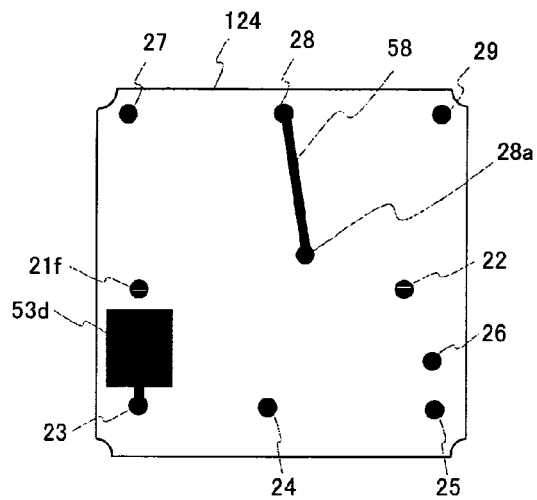

Referring to FIG. 16B, on the first line pattern layer 124, the first ground pattern 53d is provided and connected with the via 23, which is coupled to the ground terminal 63. The via 21f is provided for connecting the die attach layer 123 and the second line pattern layer 125.

Figure 16C:
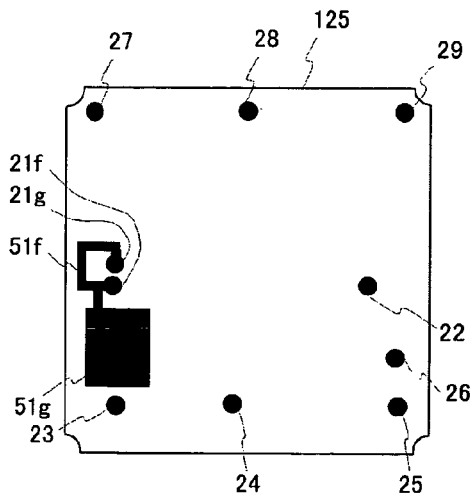

Referring to FIG. 16C, on the second line pattern layer 125, a first U-shaped line pattern 51f for receiving is provided for connecting the via 21f and a via 21g. The via 21f is coupled to the die attach layer 123, and the via 21g is coupled to the line pattern/footpad layer 126. An input/output pattern 51g is also provided and connected to the first U-shaped line pattern 51f.

Figure 16D:
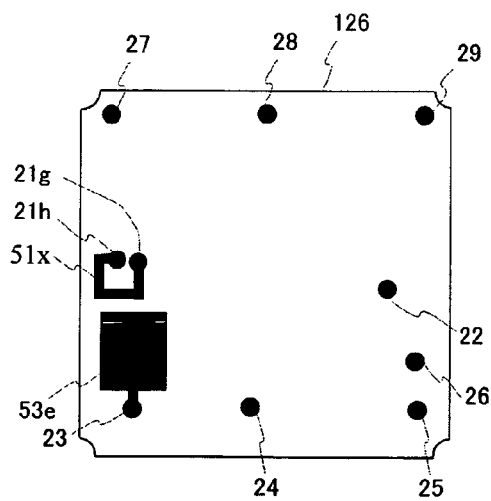

Referring to FIG. 16D, on the line pattern/footpad layer 126, a second U-shaped line pattern 51x for receiving is provided between the via 21g and a via 21h. The via 21g is coupled to the second line pattern layer 125. The via 21h is coupled to the receiving terminal (output terminal) 61 on the bottom surface of the line pattern/footpad layer 126. Also, the second ground pattern 53e is provided and connected to the via 23, which is coupled to the ground terminal 63.

The filter and duplexer used in the fifth embodiment have the afore-described configuration, in which the capacitors are created between the first ground pattern 53d and the second input/output pattern 51g and between the input/output pattern 51g and the second ground pattern 53e. Also, an inductor composed of the first U-shaped line pattern 51f and the second U-shaped line pattern 51x is connected in series with the receiving terminal (output terminal) 61 and the filter chip 110. In this manner, it is possible to connect a great capacitor and inductor in such a small space. This enables the laminated portion to be downsized, reducing the sizes of the filter and the duplexer.

Sixth Embodiment

A sixth embodiment of the present invention employs an inductor connected in series with the receiving terminal (output terminal) 61 and the output pad of the filter chip 110, and a capacitor coupled between the ground terminal 63 and the receiving terminal (output terminal) 61. The capacitor and the inductor separately branch from the receiving terminal (output terminal) 61. FIG. 17A through FIG. 17D show respective layers of the laminated package 120 used in the sixth embodiment of the present invention. The layers that are not shown in FIG. 17A through FIG. 17D have the same configuration as those shown in FIG. 5A through FIG. 5G used in the first embodiment. In the die attach layer 123 shown in FIG. 17A, a via 21i corresponds to the via 21a in FIG. 5C, and the via 22 corresponds to the via 22a in FIG. 5C. The other components and configurations as those shown in FIG. 17A have the same reference numerals as shown in FIG. 5C.

Figure 17A:
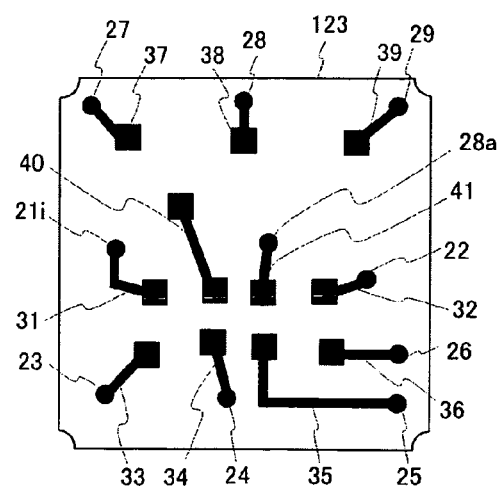
FIG. 17A through FIG. 17D respectively show the layers in the laminated package of the duplexer in accordance with a sixth embodiment of the present invention.
Figure 17B:
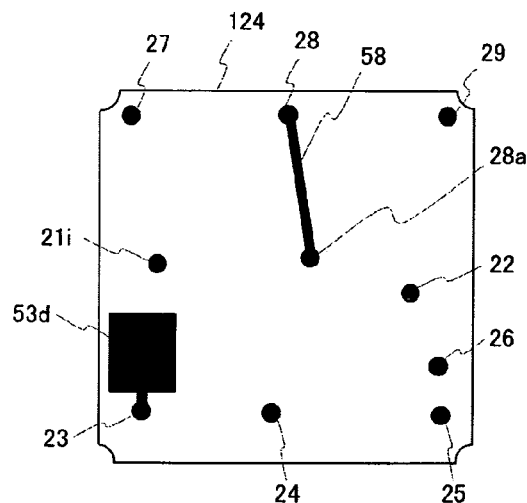
Figure 17C:
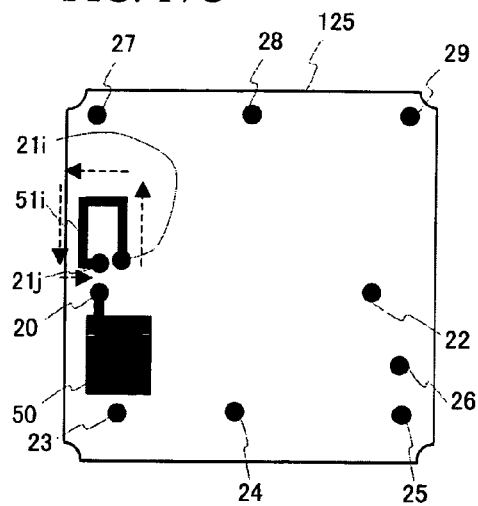
Figure 17D:
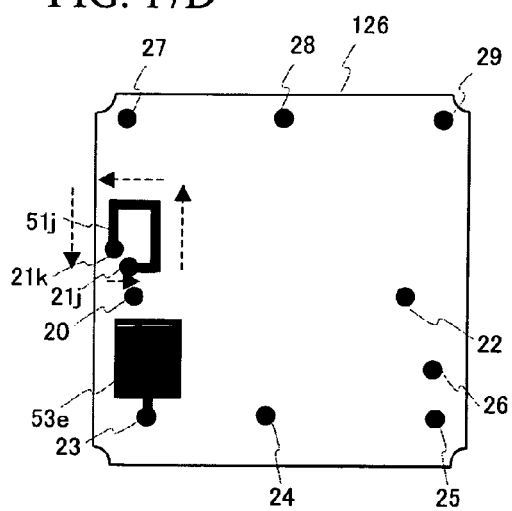

Referring to FIG. 17B, on the first line pattern layer 124, the first ground pattern 53d is provided and connected with the via 23, which is coupled to the ground terminal 63. The via 21i is provided and connected to the die attach layer 123 and the second line pattern layer 125. Referring to FIG. 17C, on the second line pattern layer 125, a first U-shaped line pattern 51i for receiving is provided and connected with the via 21i and a via 21j. The via 21i is coupled to the die attach layer 123. The via 21j is coupled to the top surface of the line pattern/footpad layer 126. The input/output pattern 50 is also connected to a via 20, which is coupled to the receiving terminal (output terminal) 61. Referring to FIG. 17D, on the top surface of the line pattern/footpad layer 126, a second U-shaped line pattern 51j for receiving is provided and connected to the via 21j and a via 21k. The via 21j is coupled to the second line pattern 125. The via 21k is coupled to the receiving terminal (output terminal) 61 on the bottom surface of the line pattern/footpad layer 126. The second ground pattern 53e is provided and connected with the via 23, which is coupled to the ground terminal 63.

The filter and duplexer used in the sixth embodiment have the afore-described configuration, in which the capacitors are created between the first ground pattern 53d and the second input/output pattern 50 and between the input/output pattern 50 and the second ground pattern 53e. Also, an inductor composed of the first U-shaped line pattern 51i and the second U-shaped line pattern 51j is connected in series with the receiving terminal (output terminal) 61 and the filter chip 110. In this manner, as described in the fifth embodiment, it is possible to apply a great capacitor and inductor in a small space. This enables the laminated portion to be downsized, reducing the sizes of the filter and the duplexer.

Furthermore, in addition to the configuration employed in the fifth embodiment, U-shaped line patterns 51i and 52j are provided. The input/output pattern 50 and the U-shaped line patterns 51i and 52j respectively branch from the receiving terminal (output terminal) 61, and are coupled to the filter chip 110 in parallel. Here, the input/output pattern may branch from the U-shaped line pattern, as described in the fifth embodiment, and the input/output pattern may branch from the receiving terminal (output terminal) 61 or the transmitting terminal (input terminal) 62, as described in sixth embodiment.

The fourth through sixth embodiments include the capacitor or the inductor coupled to the receiving terminal (output terminal) 61. The capacitor or the inductor may be coupled to a ground terminal of the transmitting terminal (input terminal), according to the need that the capacitance or inductance should be applied. Also, the capacitor or inductor may be applied to both the receiving terminal (output terminal) 61 and the transmitting terminal (input terminal) 62.

In the first through sixth embodiments, preferably, the respective layers in the base layer 128 have thickness of 25 μm to 125 μm. If an inductor is connected and the thickness is less than 25 μm, the inductance becomes greater and the capacitance also becomes greater. Consequently, the insertion loss becomes greater. If the thickness is larger than 125 μm, the capacitance becomes smaller and the inductance also becomes smaller. This makes it difficult to achieve one object of downsizing the filter and the duplexer. If the capacitor is connected and the thickness is less than 25 μm, the capacitance becomes greater and the inductance also becomes greater. Consequently, the insertion loss becomes greater. If the thickness is larger than 125 μm, the inductance becomes smaller and the capacitance also becomes smaller. This makes it difficult to achieve one object of downsizing the filter and the duplexer.

In addition, in the first through sixth embodiments, the filter chip 110 and the phase-matching circuit 132 are mounted on the laminated package 120. However, a laminated substrate or the like may be employed, if the laminated portion in which an insulating film made of ceramic and the like are laminated is included and the filter chip 110 can be mounted on the substrate. The receiving filter 113 and the transmitting filter 112 are formed on an identical chip to serve as the filter chip 110. However, the receiving filter 113 and the transmitting filter 112 may be formed on different chips and mounted on different laminated portions. Furthermore, the filter may include either the filter chip for receiving or the filter chip for transmitting.

Moreover, the filter chip 110 and the phase-matching circuit 132 are mounted on the laminated portion by means of the bumps 130. In other words, the filter chip 110 and the phase-matching circuit 132 are face-down bonded. However, the filter chip 110 and the phase-matching circuit 132 may be mounted on the laminated portion by wire bonding. In other words, the filter chip 110 and the phase-matching circuit 132 may be face-up bonded.

The receiving filter 113 and the transmitting filter 112 are chips that employ the SAW filters. However, the chip may employ, for example, a filter having a piezoelectric thin-film resonator.

Seventh Embodiment

Figure 18:
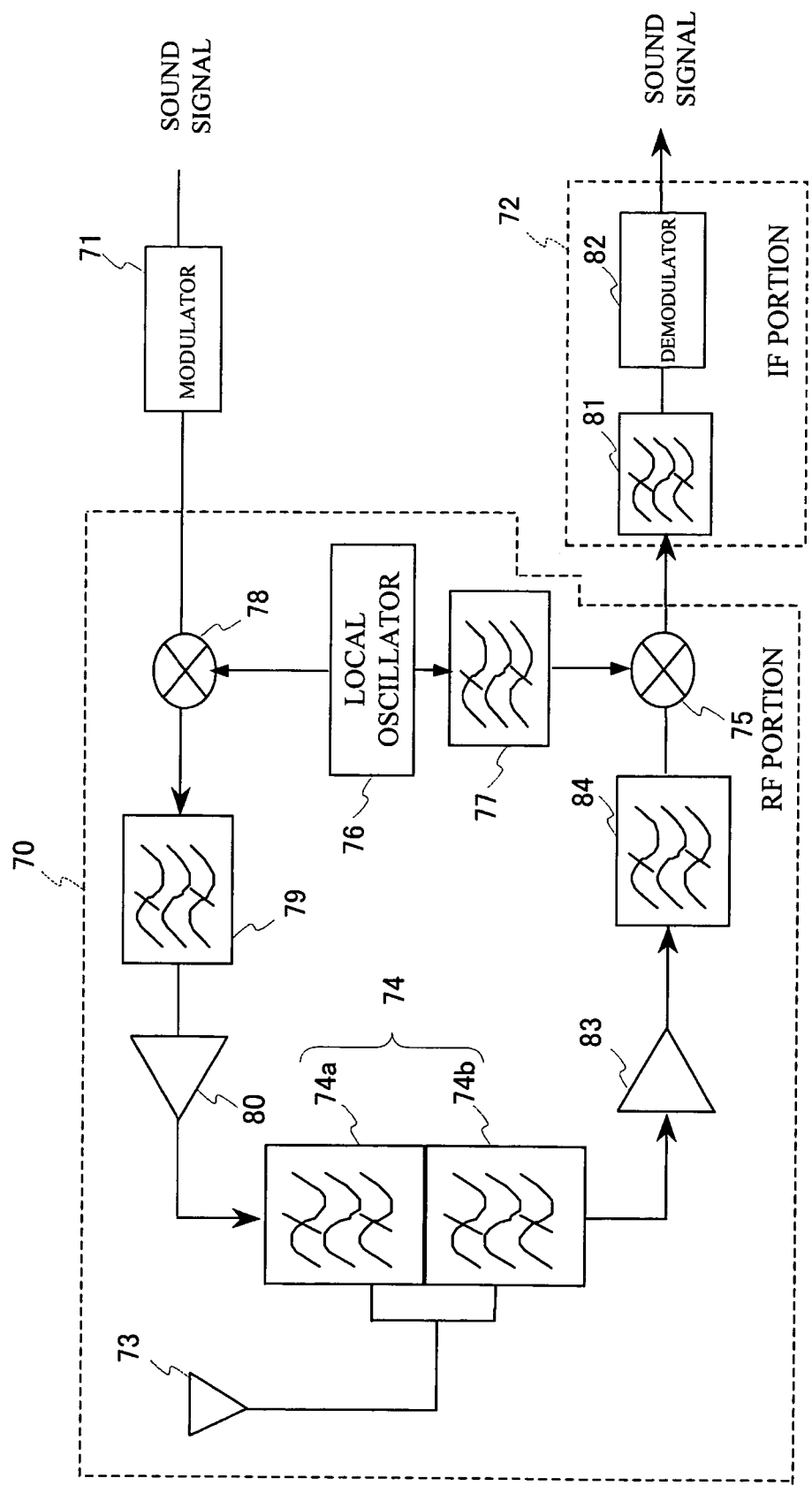
FIG. 18 is a block diagram of an electronic apparatus in accordance with a seventh embodiment of the present invention.

FIG. 18 is a block diagram of an electronic apparatus in accordance with a seventh embodiment of the present invention. The electronic apparatus serves as a transmitting and receiving system of a mobile telephone. The transmitting and receiving system of the mobile telephone includes an RF portion 70, a modulator 71, and an IF portion 72. The RF portion 70 includes an antenna 73, a duplexer 74, a low noise amplifier 83, an interstage filter 84, a mixer 75, a local oscillator 76, an interstage filter 77, a mixer 78, an interstage filter 79, and a power amplifier 80. A sound signal input from a sound processing system is modulated on the modulator 71, and the frequency is converted with the use of an oscillation signal of the local oscillator 76 in the mixer 78 of the RF portion 70. The signal output from the mixer 78 passes through the interstage filter 79 and the power amplifier 80, and reaches the duplexer 74.

The duplexer 74 employs any one of the duplexers employed in the first through sixth embodiments, and includes a transmitting filter 74a, a receiving filter 74b, and a phase-matching circuit (not shown). A transmitting signal is output from the power amplifier 80, passes through the transmitting filter 74a of the duplexer 74, and is supplied to the antenna 73. A received signal on the antenna 73 passes through a receiving filter 74b of the duplexer 74, passes through the low noise amplifier 83 and the interstage filter 84, and reaches the mixer 75. The mixer 75 receives the oscillation frequency of the local oscillator 76 via the interstage filter 77, converts the frequency of the received signal, and outputs to the IF portion 72. The IF portion 72 receives the aforementioned signal via an IF filter 81, demodulates the signal on a demodulator 82, and outputs the sound signal to the sound processing system.

The electronic apparatus used in the seventh embodiment employs any one of the duplexers exemplified in the first through sixth embodiments, therefore providing a downsized, low-cost, and high-performance electronic apparatus.

There is provided a filter including: a filter chip; a laminated portion on which the filter chip is mounted; an input/output terminal provided in the laminated portion; a first U-shaped line pattern provided on a first layer and coupled to the filter chip, the first layer being included in the laminated portion between the filter chip and the input/output terminal; and a second U-shaped line pattern provided on a second layer to substantially overlap the first U-shaped line pattern and coupled to the first U-shaped line pattern and the input/output terminal, the second layer being included in the laminated portion between the first layer and the input/output terminal.

In the above-described filter, a current flowing across the first U-shaped line pattern may have a same direction as the current flowing across the second U-shaped line pattern. In accordance with the present invention, the self-inductance of the line pattern can be further increased. This further downsizes the filter and reduces the insertion loss.

The above-described filter may further include a third U-shaped line pattern, which is provided in one or more layers in the laminated portion between the second layer and the input/output terminal, is coupled to the second U-shape line pattern and the input/output terminal, and has a same current direction as a current flowing across the second U-shape line pattern. In accordance with the present invention, the self-inductance of the line pattern can be further increased. This further downsizes the filter and reduces the insertion loss.

In the above-described filter, the first U-shaped line pattern, the second U-shaped line pattern, and the third U-shaped line pattern may be formed to overlap the input/output terminal. The first U-shaped line pattern, the second U-shaped line pattern, and the third U-shaped line pattern may be formed not to overlap a ground pattern in the laminated portion. In accordance with the present invention, the capacitance applied between the U-shaped line pattern and the ground can be reduced, enabling the insertion loss to be reduced.

In the above-described filter, the first U-shaped line pattern, the second U-shaped line pattern, and the third U-shaped line pattern may respectively have a distance between lines greater than a line width. In accordance with the present invention, the inductance of the U-shaped line pattern can be increased, reducing the sizes of the filter and the duplexer.

There is provided a filter including: a filter chip; a laminated portion on which the filter chip is mounted; a ground terminal provided in the laminated portion; a first U-shaped ground pattern provided on a first layer and coupled to the filter chip, the first layer being included in the laminated portion between the filter chip and the ground terminal; and a second U-shaped ground pattern provided on a second layer to substantially overlap the first U-shaped ground pattern and coupled to the first U-shaped ground pattern and the ground terminal, the second layer being included in the laminated portion between the first layer and the ground terminal.

In the above-described filter, a current flowing across the first U-shaped ground pattern may have a same direction as the current flowing across the second U-shaped ground pattern. In accordance with the present invention, it is possible to increase the self-inductance of the ground pattern and further downsize the filter.

The above-described filter may further include a third U-shaped ground pattern that is provided in one or more layers in the laminated portion between the second layer and the ground terminal, is coupled to the second U-shape ground pattern and the ground terminal, and has a same current direction as a current flowing across the second U-shape ground pattern. In accordance with the present invention, it is possible to increase the self-inductance of the ground pattern and further downsize the filter.

In the above-described filter, the first U-shaped ground pattern, the second U-shaped ground pattern, and the third U-shaped ground pattern may be formed not to overlap a conductive pattern in the laminated portion. In accordance with the present invention, it is possible to reduce the capacitance applied between terminals other than the ground terminal and the ground, and to reduce the insertion loss.

There is provided a filter including: a filter chip; a laminated portion on which the filter chip is mounted; a ground terminal provided in the laminated portion; a first ground pattern provided on a first layer and coupled to the filter chip, the first layer being included in the laminated portion between the filter chip and the ground terminal; a second ground pattern provided on a third layer to substantially overlap the first ground pattern and coupled to the first ground pattern and the ground terminal, the third layer being included in the laminated portion between the first layer and the ground terminal; and an input/output pattern provided on a second layer to substantially overlap the first ground pattern and the second ground pattern and coupled to the filter chip and an input/output terminal, the second layer being included in the laminated portion between the first layer and the third layer.

In the above-described filter, the first ground pattern and the second ground pattern may be formed not to overlap the input/output terminal in the laminated portion. In accordance with the present invention, the capacitance applied between the ground pattern and the input/output terminal can be reduced and the insertion loss can be reduced.

In the above-described filter, the input/output pattern may have a smaller area than at least one of areas of the first ground pattern and the second ground pattern. In accordance with the present invention, it is possible to form the input/output pattern certainly between the first ground pattern and the second ground pattern, even if the layers are misaligned in the fabrication process of the laminated portion. It is therefore possible to eliminate the variation in the capacitance production.

The above-described filter may further include a U-shaped line pattern coupled to the filter chip and the input/output terminal. In the above-described filter, the input/output pattern and the U-shaped line pattern may respectively branch from the input/output terminal. In accordance with the present invention, it is possible to apply a capacitor having a great capacitance and an inductor in a small space. This can reduce the size of the laminated portion and the filter.

In the above-described filter, the filter chip may include a surface acoustic wave filter. The filter chip may include a filter having a piezoelectric thin-film resonator.

There is provided a duplexer including a transmitting filter coupled to a transmitting terminal; a receiving filter coupled to a receiving terminal; a phase-matching circuit coupled to a common terminal, the transmitting terminal, and the receiving terminal to match phases of the transmitting filter and the receiving filter; and a laminated portion on which the phase-matching circuit is mounted. The transmitting filter and the receiving filter may respectively include any of the above-described filters.

In the afore-described duplexer, the laminated portion may be commonly provided to the transmitting filter and the receiving filter.

The present invention is not limited to the above-mentioned embodiments, and other embodiments, variations and modifications may be made without departing from the scope of the present invention.

The present invention is based on Japanese Patent Application No. 2005-123189 filed on Apr. 21, 2005, the entire disclosure of which is hereby incorporated by reference.

What is claimed is:

1. A filter comprising:
a filter chip;
a laminated portion on which the filter chip is mounted;
an input/output terminal provided in the laminated portion;
a first U-shaped line pattern provided on a first layer and coupled to the filter chip, the first layer being included in the laminated portion between the filter chip and the input/output terminal;
a second U-shaped line pattern provided on a second layer to substantially overlap the first U-shaped line pattern and coupled to the first U-shaped line pattern and the input/output terminal, the second layer being included in the laminated portion between the first layer and the input/output terminal; and
a third U-shaped line pattern, which is provided in one or more layers in the laminated portion between the second layer and the input/output terminal, is coupled to the second U-shape line pattern and the input/output terminal, and has a same current direction as a current flowing across the second U-shape line pattern;
wherein the first U-shaped line pattern, the second U-shaped line pattern, and the third U-shaped line pattern are formed to overlap the input/output terminal.

2. The filter as claimed in claim 1, wherein a current flowing across the first U-shaped line pattern has a same direction as the current flowing across the second U-shaped line pattern.

3. The filter as claimed in claim 1, wherein the filter chip includes a surface acoustic wave filter.

4. The filter as claimed in claim 1, wherein the filter chip includes a filter having a piezoelectric thin-film resonator.

5. A filter comprising:
a filter chip;
a laminated portion on which the filter chip is mounted;
an input/output terminal provided in the laminated portion;
a first U-shaped line pattern provided on a first layer and coupled to the filter chip, the first layer being included in the laminated portion between the filter chip and the input/output terminal;
a second U-shaped line pattern provided on a second layer to substantially overlap the first U-shaped line pattern and coupled to the first U-shaped line pattern and the input/output terminal, the second layer being included in the laminated portion between the first layer and the input/output terminal; and
a third U-shaped line pattern, which is provided in one or more layers in the laminated portion between the second layer and the input/output terminal, is coupled to the second U-shaped line pattern and the input/output terminal, and has a same current direction as a current flowing across the second U-shaped line pattern;
wherein the first U-shaped line pattern, the second U-shaped line pattern, and the third U-shaped line pattern are formed not to overlap a ground pattern in the laminated portion.

6. A filter comprising:
a filter chip:
a laminated portion on which the filter chip is mounted;
an input/output terminal provided in the laminated portion;
a first U-shaped line pattern provided on a first layer and coupled to the filter chip, the first layer being included in the laminated portion between the filter chip and the input/output terminal;
a second U-shaped line pattern provided on a second layer to substantially overlap the first U-shaped line pattern and coupled to the first U-shaped line pattern and the input/output terminal, the second layer being included in the laminated portion between the first layer and the input/output terminal; and
a third U-shaped line pattern, which is provided in one or more layers in the laminated portion between the second layer and the input/output terminal, is coupled to the second U-shaped line pattern and the input/output terminal, and has a same current direction as a current flowing across the second U-shaped line pattern;
wherein the first U-shaped line pattern, the second U-shaped line pattern, and the third U-shaped line pattern respectively have a distance between lines greater than a line width.

7. A filter comprising:
a filter chip;
a laminated portion on which the filter chip is mounted;
a ground terminal provided in the laminated portion;
a first U-shaped ground pattern provided on a first layer and coupled to the filter chip, the first layer being included in the laminated portion between the filter chip and the ground terminal;
a second U-shaped ground pattern provided on a second layer to substantially overlap the first U-shaped ground pattern and coupled to the first U-shaped ground pattern and the ground terminal, the second layer being included in the laminated portion between the first layer and the ground terminal; and
a third U-shaped ground pattern that is provided in one or more layers in the laminated portion between the second layer and the ground terminal, is coupled to the second U-shaped around pattern and the ground terminal, and has a same current direction as a current flowing across the second U-shaped ground pattern;

wherein the first U-shaped ground pattern, the second U-shaped ground pattern, and the third U-shaped ground pattern are formed not to overlap a conductive pattern in the laminated portion.

8. The filter as claimed in claim 7, wherein a current flowing across the first U-shaped ground pattern has a same direction as the current flowing across the second U-shaped ground pattern.

9. A filter comprising:
a filter chip;
a laminated portion on which the filter chip is mounted;
a ground terminal provided in the laminated portion;
a first ground pattern provided on a first layer and coupled to the filter chip, the first layer being included in the laminated portion between the filter chip and the ground terminal;
a second ground pattern provided on a third layer to substantially overlap the first ground pattern and coupled to the first ground pattern and the ground terminal, the third layer being included in the laminated portion between the first layer and the ground terminal;
an input/output pattern provided on a second layer to substantially overlap the first ground pattern and the second ground pattern and coupled to the filter chip and an input/output terminal, the second layer being included in the laminated portion between the first layer and the third layer; and
a U-shaped line pattern coupled to the filter chip and the input/output terminal.

10. The filter as claimed in claim 9, wherein the first ground pattern and the second ground pattern are formed not to overlap the input/output terminal in the laminated portion.

11. The filter as claimed in claim 9, wherein the input/output pattern has a smaller area than at least one of areas of the first ground pattern and the second ground pattern.

12. The filter as claimed in claim 9, wherein the input/output pattern and the U-shaped line pattern respectively branch from the input/output terminal.

13. A duplexer comprising:
a transmitting filter coupled to a transmitting terminal;
a receiving filter coupled to a receiving terminal;
a phase-matching circuit coupled to a common terminal, the transmitting terminal, and the receiving terminal to match phases of the transmitting filter and the receiving filter; and
a laminated portion on which the phase-matching circuit is mounted,
wherein the transmitting filter and the receiving filter respectively include:
a filter chip;
a laminated portion on which the filter chip is mounted;
an input/output terminal provided in the laminated portion;
a first U-shaped line pattern provided on a first layer and coupled to the filter chip, the first layer being included in the laminated portion between the filter chip and the input/output terminal;
a second U-shaped line pattern provided on a second layer to substantially overlap the first U-shaped line pattern and coupled to the first U-shaped line pattern and the input/output terminal, the second layer being included in the laminated portion between the first layer and the input/output terminal; and
a third U-shaped line pattern, which is provided in one or more layers in the laminated portion between the second layer and the input/output terminal, is coupled to the second U-shaped line pattern and the input/output terminal, and has a same current direction as a current flowing across the second U-shaped line pattern;
wherein the first U-shaped line pattern, the second U-shaped line pattern, and the third U-shaped line pattern are formed to overlap the input/output terminal.

14. The duplexer as claimed in claim 13, wherein the laminated portion is commonly provided to the transmitting filter and the receiving filter.

\* \* \* \* \*